(12) United States Patent
Lee et al.

(10) Patent No.: US 11,905,170 B2
(45) Date of Patent: Feb. 20, 2024

(54) MEMS TAB REMOVAL PROCESS

(71) Applicant: InvenSense, Inc., San Jose, CA (US)

(72) Inventors: Daesung Lee, San Jose, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 248 days.

(21) Appl. No.: 17/547,388

(22) Filed: Dec. 10, 2021

(65) Prior Publication Data
US 2022/0185662 A1 Jun. 16, 2022

Related U.S. Application Data

(60) Provisional application No. 63/199,240, filed on Dec. 15, 2020.

(51) Int. Cl.
*B81C 1/00* (2006.01)

(52) U.S. Cl.
CPC .. *B81C 1/00896* (2013.01); *B81C 2203/0785* (2013.01)

(58) Field of Classification Search
CPC ........ B81C 1/00896; B81C 2203/0785; B81C 1/00301; B81C 1/00238
See application file for complete search history.

(56) References Cited

U.S. PATENT DOCUMENTS

| 2006/0228831 | A1 | 10/2006 | Nasiri et al. | |
| 2009/0246938 | A1* | 10/2009 | Kim | H01L 21/78 257/E21.257 |
| 2016/0318755 | A1 | 11/2016 | Lee | |
| 2018/0022603 | A1* | 1/2018 | Chu | B81C 1/00825 257/416 |

FOREIGN PATENT DOCUMENTS

CN 109153560 A 1/2019

OTHER PUBLICATIONS

International Search Report and Written Opinion received for PCT Patent Application No. PCT/US2021/062754, dated May 18, 2022, 11 pages.
Foreign office action dated Jan. 31, 2023 and ISR.

\* cited by examiner

*Primary Examiner* — Shahed Ahmed
*Assistant Examiner* — Sun Mi Kim King

(57) ABSTRACT

A method includes tab dicing a region of a tab region disposed between a first die and a second die. The tab region structurally connects the first die to the second die each including a MEMS device eutecticly bonded to a CMOS device. The tab region includes a handle wafer layer disposed over a fusion bond oxide layer that is disposed on an ACT layer. The tab region is positioned above a CMOS tab region that with the first and second die form a cavity therein. The tab dicing cuts through the handle wafer layer and leaves a portion of the fusion bond oxide layer underneath the handle wafer layer to form an oxide tether within the tab region. The oxide tether maintains the tab region in place and above the CMOS tab region. Subsequent to the tab dicing the first region, the tab region is removed.

31 Claims, 37 Drawing Sheets

```
┌─────────────────────────────────────────────────────────────────┐
│ Tab dicing a first region of a tab region that cuts through the │
│ handle wafer layer and leaves a portion of the fusion bond oxide │
│ layer underneath the handle wafer layer that was cut to         │
│ form an oxide tether                                             │
│                            1110                                  │
└─────────────────────────────────────────────────────────────────┘
                                │
┌─────────────────────────────────────────────────────────────────┐
│            Optionally forming a pre-cut in the tab region        │
│                            1120                                  │
└─────────────────────────────────────────────────────────────────┘
                                │
┌─────────────────────────────────────────────────────────────────┐
│              Optionally forming a eutectic bond tether           │
│                            1130                                  │
└─────────────────────────────────────────────────────────────────┘
                                │
┌─────────────────────────────────────────────────────────────────┐
│               Optionally forming an ACT layer tether             │
│                            1140                                  │
└─────────────────────────────────────────────────────────────────┘
                                │
┌─────────────────────────────────────────────────────────────────┐
│        Subsequent to the tab dicing, removing the tab region     │
│                            1150                                  │
└─────────────────────────────────────────────────────────────────┘
```

Figure 11

MEMS TAB REMOVAL PROCESS

RELATED APPLICATIONS

The instant application is a non-provisional application and claims the benefit and priority to a provisional application No. 63/199,240 that was filed on Dec. 15, 2020, which is incorporated herein in its entirety.

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. Some MEMS devices may be formed by bonding a MEMS wafer to a Semiconductor wafer, where the MEMS wafer may include a handle wafer and a device layer and wherein the semiconductor wafer may include sensing electrodes and other circuitries. The MEMS wafer is generally separated from the semiconductor wafer and during a tab removal, the handle and a device layer (or a portion thereof) is removed to expose circuitries on the semiconductor wafer.

Unfortunately, the current tab removal process is through a dicing process that is not only manual in nature but also results in high yield losses as well as poor quality issues. For example, during the current tab removal process the MEMS wafer is sawed and the edges are trimmed to release the tab, e.g., using high pressure Nitrogen. When the tab is being removed, it may damage the surfaces surrounding it, e.g., MEMS chipping, the semiconductor passivation layer, etc. Some etch the entire tab using a costly process such as deep reactive ion etching (DRIE).

SUMMARY

Accordingly, a need has arisen to utilize one or more tethers, e.g., an oxide tether, an actuator layer (ACT) tether, a eutectic bond tether, etc., to prevent the tab from being released and from damaging the surrounding areas. The tab is tethered to the die after the tab dicing process, e.g., sawing. In other words, during the tab dicing process the tab is held in place using the tether(s) but not removed until the one or more tethers is broken. The tether(s) may be broken during a tab removal process that may be tape based or vacuum pick, thereby separating the tab from the die.

A method includes forming a pre-cut in a tab region disposed between a first die and a second die. The tab region structurally connects the first die to the second die. The first die comprises a first Micro-Electromechanical System (MEMS) device eutecticly bonded to a first semiconductor, e.g., a Complementary Metal-Oxide-Semiconductor (CMOS) device. The second die comprises a second MEMS device eutecticly bonded to a second semiconductor, e.g., a CMOS device. The tab region includes a handle wafer layer disposed over a fusion bond oxide layer that is disposed on an actuator (ACT) layer. The tab region is positioned above a semiconductor tab region, e.g., a CMOS tab region. The tab region, the first die, the second die, and the semiconductor tab region form a cavity therein. The method also includes tab dicing a first region of the tab region that corresponds to the pre-cut that cuts through the handle wafer layer, the fusion bond oxide layer, and the ACT layer to expose the semiconductor tab region. The method further includes tab dicing a second region of the tab region that cuts through the handle wafer layer and that leaves a portion of the ACT layer underneath to form an ACT tether. The ACT tether structurally maintains the tab region in place and above the semiconductor tab region. The method subsequent to the tab dicing the first region and the second region includes removing the tab region.

In some embodiments the tab dicing is via one of blade sawing, plasma etching, or deep reactive-ion etching (DRIE). It is appreciated that in some embodiments, the removing is through one of a tape removal or vacuum pick. In some embodiments, the method further includes forming an eutectic bond tether that structurally connects the ACT layer of the tab region to the semiconductor tab region and maintains the tab region in place and above the semiconductor tab region subsequent to the tab dicing the first and the second regions. In some embodiments, the method includes forming an oxide tether within the fusion bond oxide layer, wherein the oxide tether that is positioned over the ACT layer tether, wherein the oxide tether maintains the tab region in place and above the semiconductor tab region subsequent to the tab dicing the first and the second regions. In some embodiments, the oxide tether is formed using a deep reactive-ion etching (DRIE). In some embodiments, the handle wafer may include silicon. It is appreciated that the semiconductor tab region may include a bond pad that is positioned outside of a eutectic bond seal ring. According to some embodiments, the pre-cut in the tab region is partial cut into the ACT layer and formed during MEMS wafer processing. According to one embodiment, the fusion bond oxide layer forms an enclosed cavity over the ACT layer tether prior to the tab dicing the second region of the tab region.

A method includes tab dicing a first region of a tab region disposed between a first die and a second die. The tab region structurally connects the first die to the second die, wherein the first die comprises a first Micro-Electromechanical System (MEMS) device eutecticly bonded to a first semiconductor, e.g., a Complementary Metal-Oxide-Semiconductor (CMOS) device. The second die includes a second MEMS device eutecticly bonded to a second semiconductor, e.g., a CMOS device, wherein the tab region includes a handle wafer layer disposed over a fusion bond oxide layer that is disposed on an actuator (ACT) layer, wherein the tab region is positioned above a semiconductor tab region. The tab region, the first die, the second die, and the semiconductor tab region form a cavity therein. The tab dicing cuts through the handle wafer layer and leaves a portion of the fusion bond oxide layer underneath the handle wafer layer that was cut to form an oxide tether within the fusion bond oxide layer of the tab region, wherein the oxide tether maintains the tab region in place and above the semiconductor tab region. In some embodiments, subsequent to the tab dicing the first region, the method includes removing the tab region.

In some embodiments, the tab dicing is via one of blade sawing, plasma etching, or deep reactive-ion etching (DRIE). According to some embodiments, the removing is through one of a tape removal or vacuum pick. In some embodiments, the method further includes forming an eutectic bond tether that structurally connects the ACT layer of the tab region to the semiconductor tab region and maintains the tab region in place and above the semiconductor tab region subsequent to the tab dicing the first region. According to some embodiments, the method further includes forming an ACT layer tether within the ACT layer of the tab region, wherein the ACT layer tether is underneath the oxide tether and maintains the tab region in place and above the semiconductor tab region subsequent to the tab dicing the first region. It is appreciated that in some embodiments, the oxide tether and the fusion bond oxide layer and the ACT layer tether form an enclosed cavity therein prior to the removing. According to some embodiments, the handle wafer comprises silicon. In some embodiments, the semiconductor tab region includes a bond pad that is positioned outside of a eutectic bond seal ring. In some embodiments, the method also includes forming a pre-cut in the tab region, wherein the pre-cut cuts at least partially through the ACT layer and is positioned under the oxide tether. It is appreciated that in some embodiments, the handle wafer layer includes a cavity coated with the fusion bond oxide layer wherein the cavity is positioned over the pre-cut, wherein the fusion bond oxide layer positioned over the pre-cut forms the oxide tether.

A method includes forming an eutectic bond tether that structurally connects a tab region to a semiconductor, e.g., a Complementary Metal-Oxide-Semiconductor (CMOS) tab region, wherein the tab region structurally connects a first die to a second die, wherein the first die comprises a first Micro-Electromechanical System (MEMS) device eutecticly bonded to a first semiconductor device. It is appreciated that the second die comprises a second MEMS device eutecticly bonded to a second semiconductor device. According to some embodiments, the tab region includes a handle wafer layer disposed over a fusion bond oxide layer that is disposed on an actuator (ACT) layer, wherein the tab region is positioned above a semiconductor tab region, and wherein the eutectic bond tether maintains the tab region in place subsequent to a tab dicing process. It is appreciated that the tab region, the first die, the second die, and the semiconductor tab region form a cavity therein. The method also includes tab dicing a first region of the tab region disposed between the first die and the second die that cuts through the handle wafer layer and the fusion bond oxide layer and the ACT layer. Subsequent to the tab dicing the first region, the method includes removing the tab region.

It is appreciated that the tab dicing is via one of blade sawing, plasma etching, or deep reactive-ion etching (DRIE). According to some embodiments, the removing is through one of a tape removal or vacuum pick. In some embodiments, the method further includes forming an oxide layer tether by tab dicing that cuts through the handle wafer layer and leaves a portion of the fusion bond oxide layer underneath the handle wafer layer that was cut, wherein the oxide tether maintains the tab region in place and above the semiconductor tab region subsequent to the tab dicing the first region of the tab region. According to some embodiments, the method may further include forming an ACT layer tether within the ACT layer of the tab region and maintains the tab region in place and above the semiconductor tab region subsequent to the tab dicing the first region of the tab region. According to some embodiments, the handle wafer comprises silicon. In some embodiments, the semiconductor tab region includes a bond pad that is positioned outside of a eutectic bond seal ring. According to one embodiment, the method further includes forming a pre-cut in the tab region, wherein the pre-cut cuts at least partially through the ACT layer. It is appreciated that in some embodiments the handle wafer layer includes a cavity coated with the fusion bond oxide layer wherein the cavity is positioned over the ACT layer.

These and other features and advantages will be apparent from a reading of the following detailed description.

BRIEF DESCRIPTION OF DRAWINGS

FIG. 11 shows another flow diagram for tab removal for a MEMS device according to one aspect of the present embodiments.

DESCRIPTION

Figure 1:
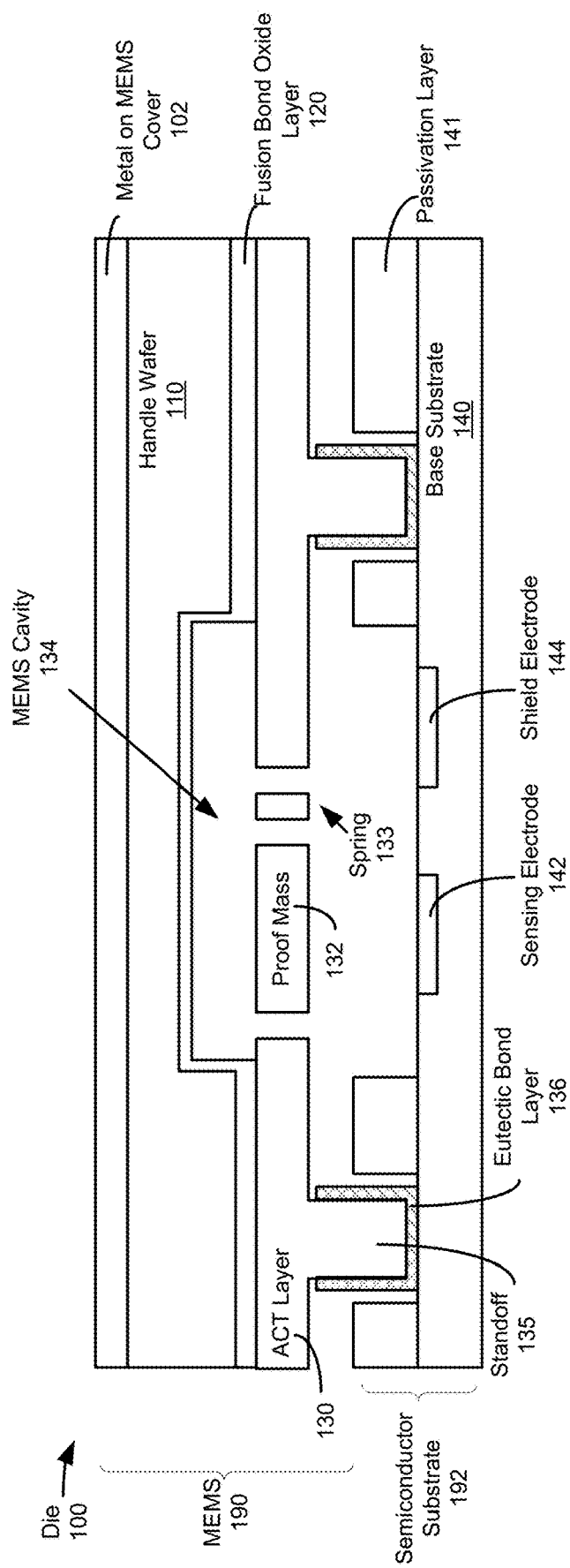
FIG. 1 shows a MEMS wafer bonded to a semiconductor wafer according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse,"

"overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS device may include a MEMS wafer that is bonded, e.g., eutecticly, to a semiconductor wafer, e.g., a CMOS. MEMS device may be accelerometer, gyroscope, etc. The MEMS wafer may include a handle wafer and a MEMS device layer also referred to an actuator layer (ACT) layer. The semiconductor wafer may include sensing electrodes, bond electrodes, bond pads, and/or other circuities. The MEMS wafer is separated from the semiconductor wafer (vertically) to allow separation between the ACT layer of the MEMS device from the bond pads on the semiconductor device. It is appreciated that any discussions with respect to a CMOS is for illustrative purposes and should not be construed as limiting the scope of the embodiments. For example, the semiconductor device may include inter metal dielectric layers over a substrate.

The MEMS device that includes a MEMS wafer bonded to a semiconductor wafer is separated from another MEMS device that includes a MEMS wafer bonded to a semiconductor wafer through a tab region that is substantially within the plane of the semiconductor wafer and a semiconductor tab region that is substantially within the plane of the semiconductor wafer. The tab region or a portion thereof is removed to expose one or more circuitries and/or bond pads on the semiconductor wafer and/or the semiconductor tab region. As described above, a need has arisen to utilize one or more tethers, e.g., an oxide tether, ACT tether, a eutectic bond tether, etc., to prevent the tab region (of a MEMS wafer bonded to a semiconductor wafer) from being released and from damaging the surrounding areas. The tab is tethered to the die, e.g., MEMS wafer (die) and/or semiconductor wafer (die), after the tab dicing process, e.g., sawing. In other words, during the tab dicing process the tab region is held in place using the tether(s) and is not removed until the one or more tethers is broken. The tether(s) may be broken during a tab removal process that may be tape based or vacuum pick, thereby separating the tab region from the die.

FIG. 1 shows a die 100 that includes a MEMS 190 wafer bonded to a semiconductor substrate 192 wafer according to one aspect of the present embodiments. The MEMS 190 wafer includes a handle wafer 110, e.g., silicon, having a cavity (i.e., MEMS cavity 134) formed therein. A fusion bond oxide layer 120 is deposited over the handle wafer 110 that is coupled to an ACT layer 130. Various MEMS features are formed (e.g., etched via a deep reactive ion etching (DRIE) process) into the ACT layer 130, e.g., proof mass 132, spring 133, etc. The MEMS 190 wafer may optionally include a layer of metal on MEMS cover 102, facing away from the semiconductor substrate 192 wafer. It is appreciated that the MEMS cavity 134 enables various MEMS features, e.g., proof mass 132, to move.

The semiconductor substrate 192 wafer may include a base substrate 140 with various circuitries, e.g., sensing electrode 142, shield electrode 144, bonding electrode (not shown), bond pad (shown in FIG. 2A), inter metal dielectric layers over a substrate, etc. A passivation layer 141 may be deposited over the base substrate 140 and it may include multiple layers, e.g., passivation nitride and passivation oxide layer. It is appreciated that the base substrate 140 may be a CMOS semiconductor.

In some embodiments, the MEMS 190 wafer is coupled to the semiconductor substrate 192 wafer via a eutectic bond layer 136 that is formed on a standoff 135 of the MEMS 190 wafer. Eutectic bond layer 136 may include aluminum and germanium in some embodiments. Coupling of the MEMS 190 wafer to the semiconductor substrate 192 wafer may form a cavity between the two. Once the MEMS 190 wafer is bonded to the semiconductor substrate 192, the two wafers are annealed and thinned on both sides. It is appreciated that after the annealing process, the metal on MEMS cover 102 may be deposited to enable MEMS cover contact. Tab dicing and tab removal is discussed in subsequent figures.

Figure 2A:
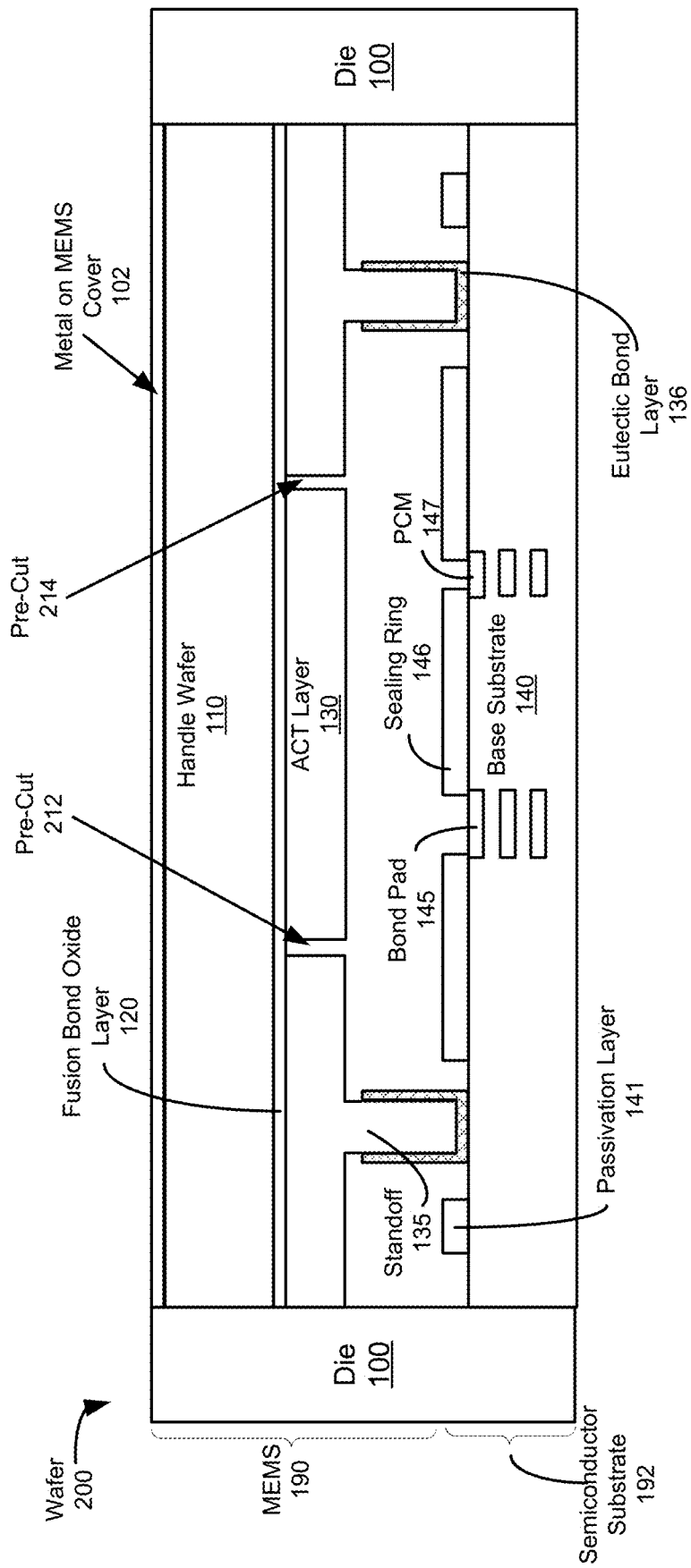
FIGS. 2A-2D show a conventional tab removal process for a MEMS device.
Figure 2B:
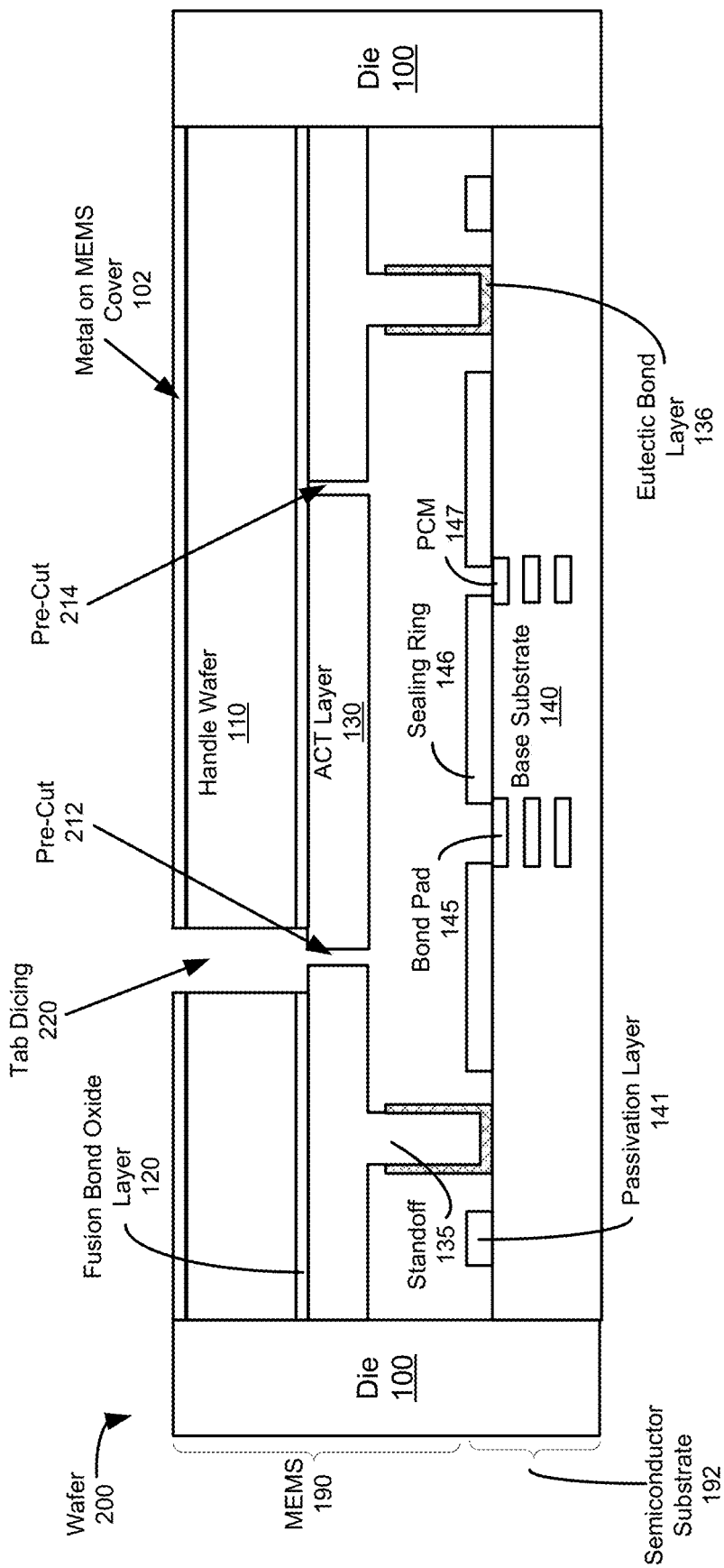
Figure 2C:
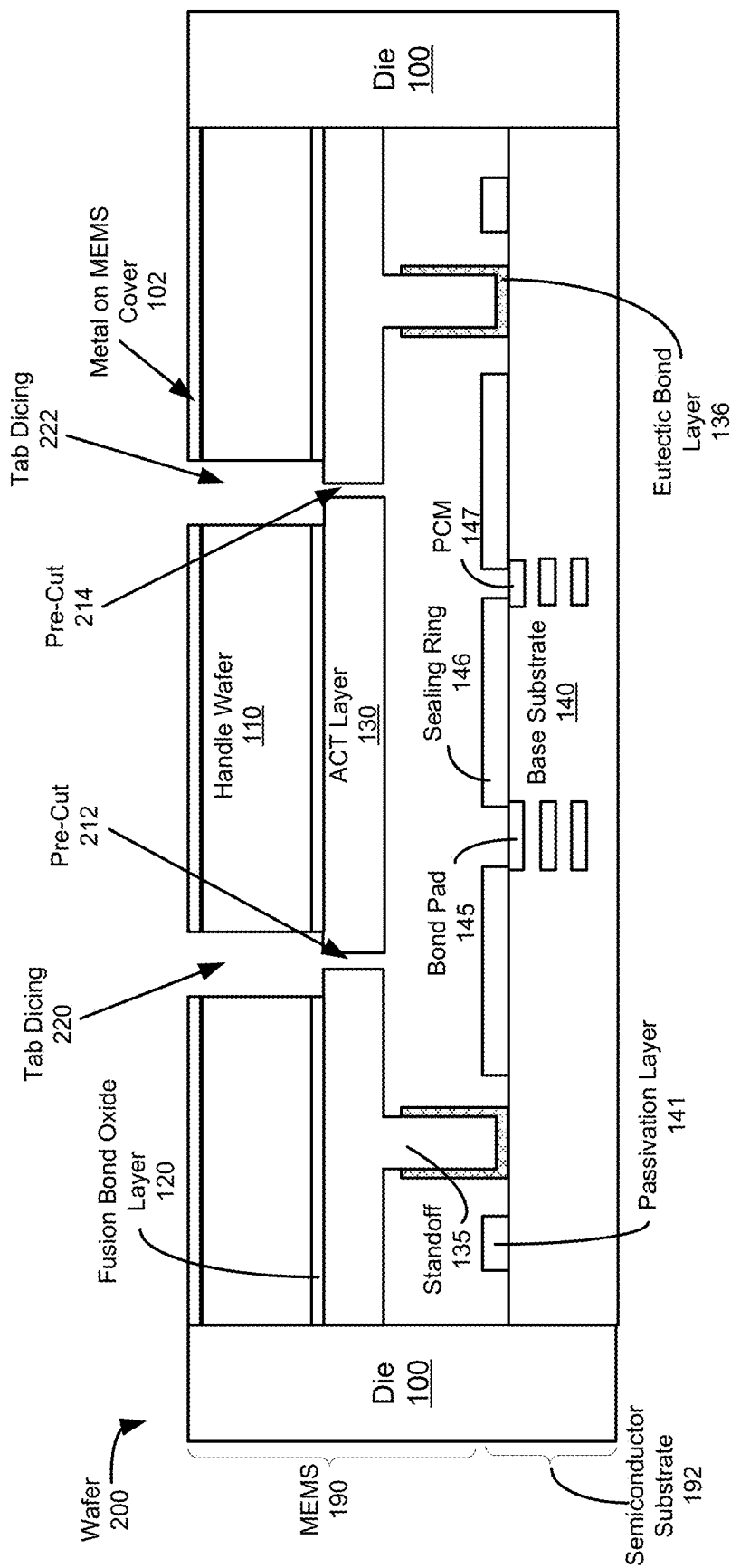
Figure 2D:
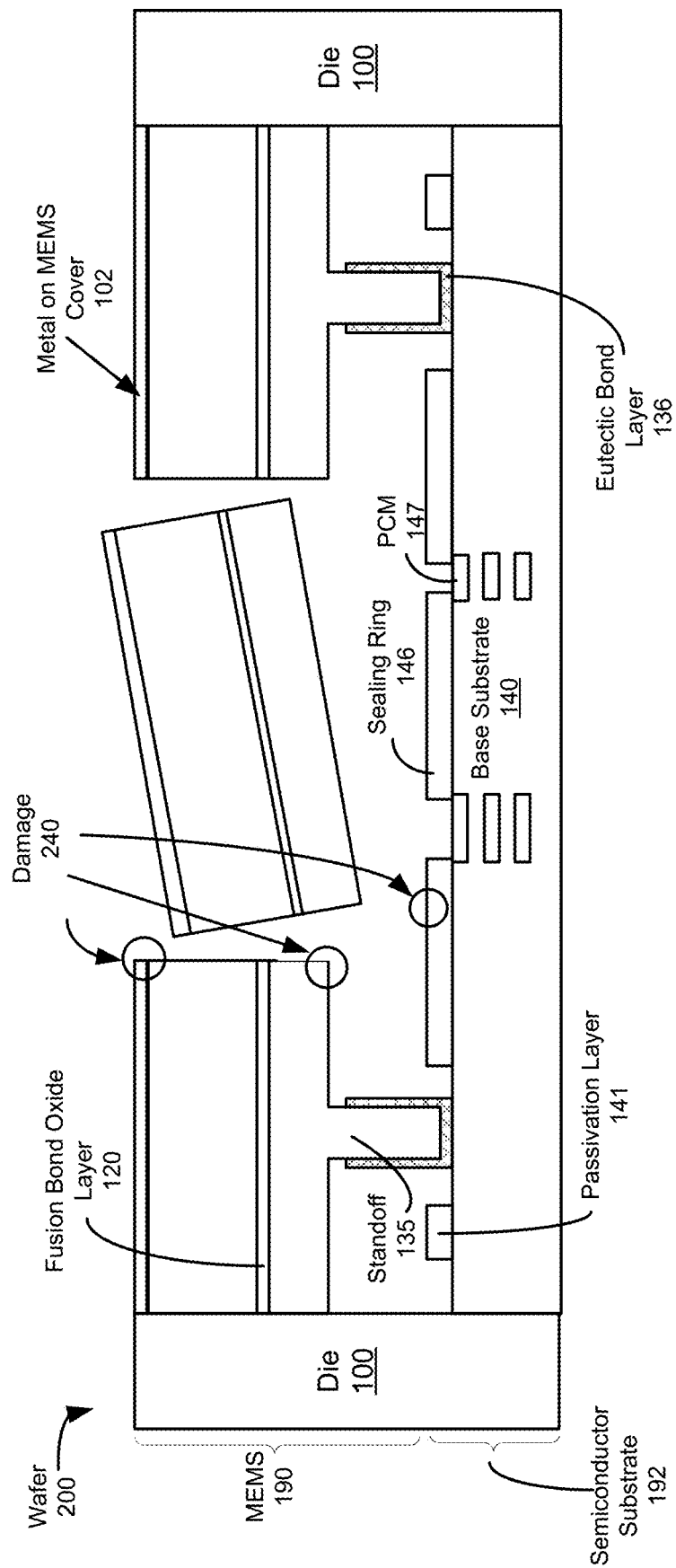

FIGS. 2A-2D show a conventional tab removal process for a MEMS device. Referring to FIG. 2A, a first die 100 (on the left) is connected to a second die 100 (on the right) through a tab region in between. It is appreciated that the tab region of FIG. 2A is similar to FIG. 1 except that the tab region of the MEMS device may not include the MEMS features, e.g., proof mass, spring, etc., while the semiconductor tab region may not include the sensing electrodes but instead includes a bond pad 145, a sealing ring 146, and a process control monitor (PCM) 147 that is a test structures located in the scribe lines. In some embodiments, the sealing ring 146 may be formed between scribe lines and integrated circuits of each die on a wafer to block unintended stress cracks from the scribe lines to the integrated circuits produced during the dicing process (i.e., wafer dicing process). It is appreciated that in some conventional processes, a first pre-cut 212 and a second pre-cut 214 are formed within the ACT layer 130 that correspond to a first and a second tab dicing areas that once are cut release the tab region. For example, as shown in FIG. 2B a first tab dicing 220 may cut (e.g., using blade saw) through the handle wafer 110 and the fusion bond oxide layer 120 to reach the first pre-cut 212. Similarly, as shown in FIG. 2C a second tab dicing 222 may cut through the handle wafer 110 and the fusion bond oxide layer 120 to reach the second pre-cut 214, which releases the tab region, as shown in FIG. 2D. As illustrated, that tab region once release may damage 240 various structures, e.g., chipping the ACT layer, damaging the semiconductor passivation layer, damaging the handle wafer, etc.

Figure 3A:
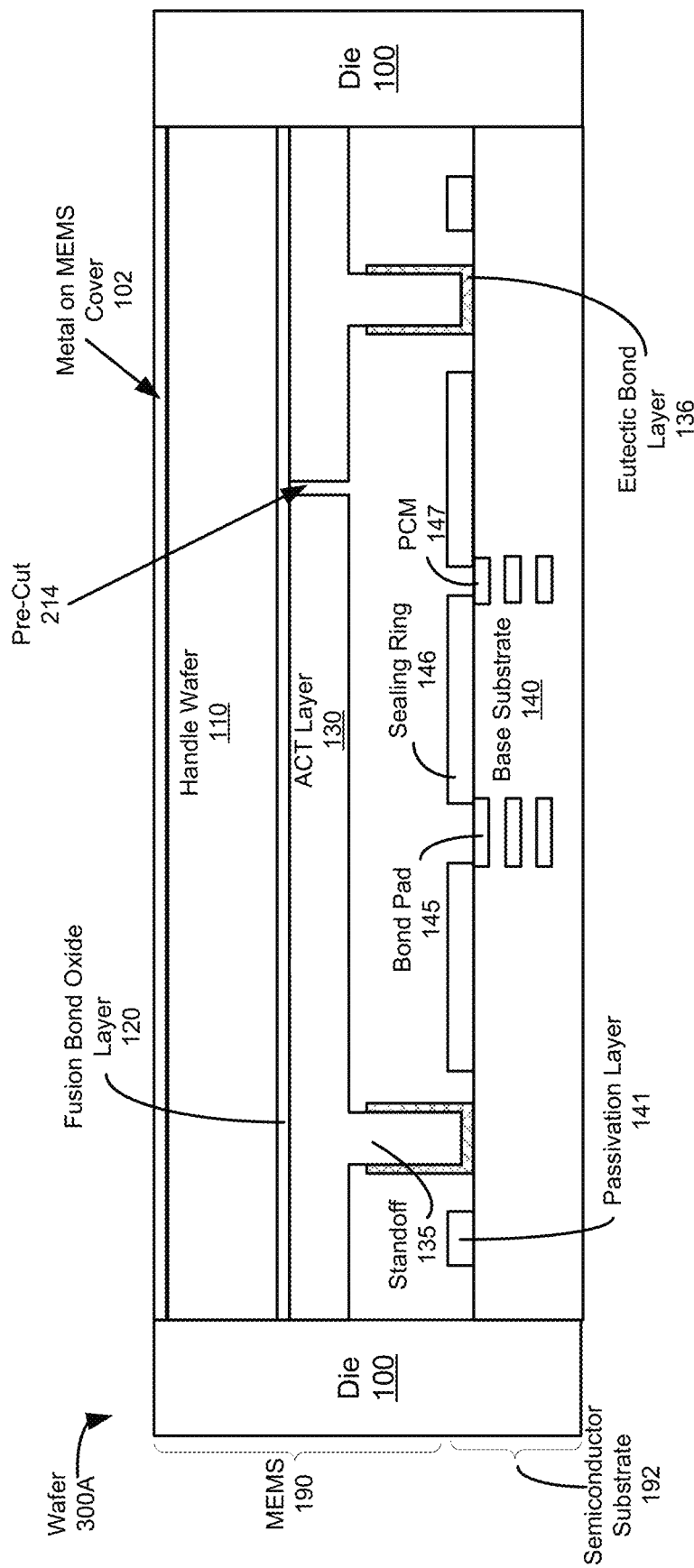
FIGS. 3A-3F show a tab removal process for a MEMS device using an ACT layer tether according to one aspect of the present embodiments.

FIGS. 3A-3F show a tab removal process for a MEMS device using an ACT layer tether according to one aspect of the present embodiments. FIG. 3A is similar to that of FIG. 2A except that wafer 300A includes two pre-cuts only one pre-cut 214 is formed in the ACT layer 130 in the tab region. It is appreciated that the tab region is positioned above the semiconductor tab region that along with the two dies 100 on either side forms a cavity therein. The tab region may include the handle wafer 110 layer and the ACT layer 130 that is positioned between the two dies 100. It is appreciated that in some embodiments, the semiconductor tab region includes a bond pad that is positioned outside of a eutectic bond seal ring before the tab dicing process.

Figure 3B:
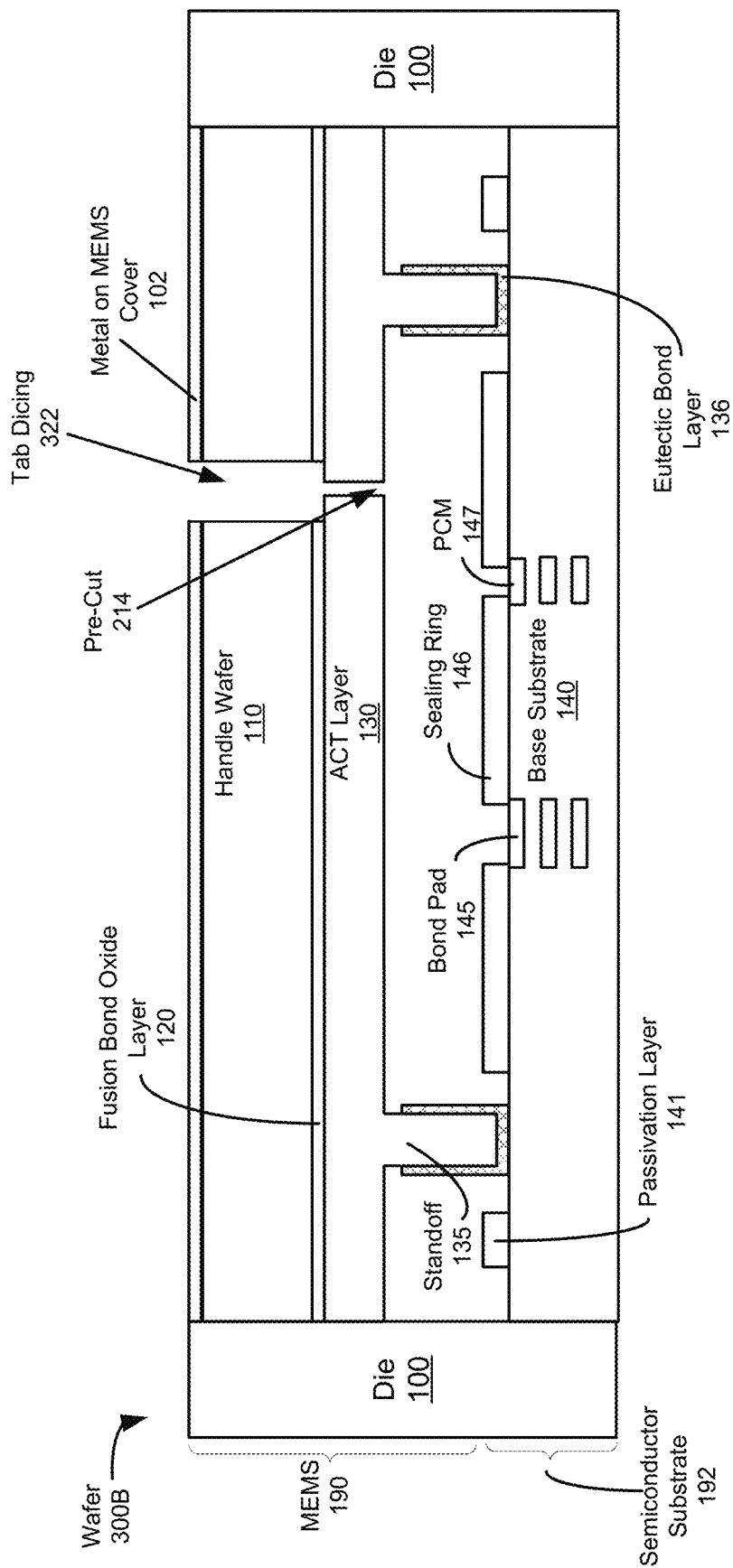
Figure 3C:
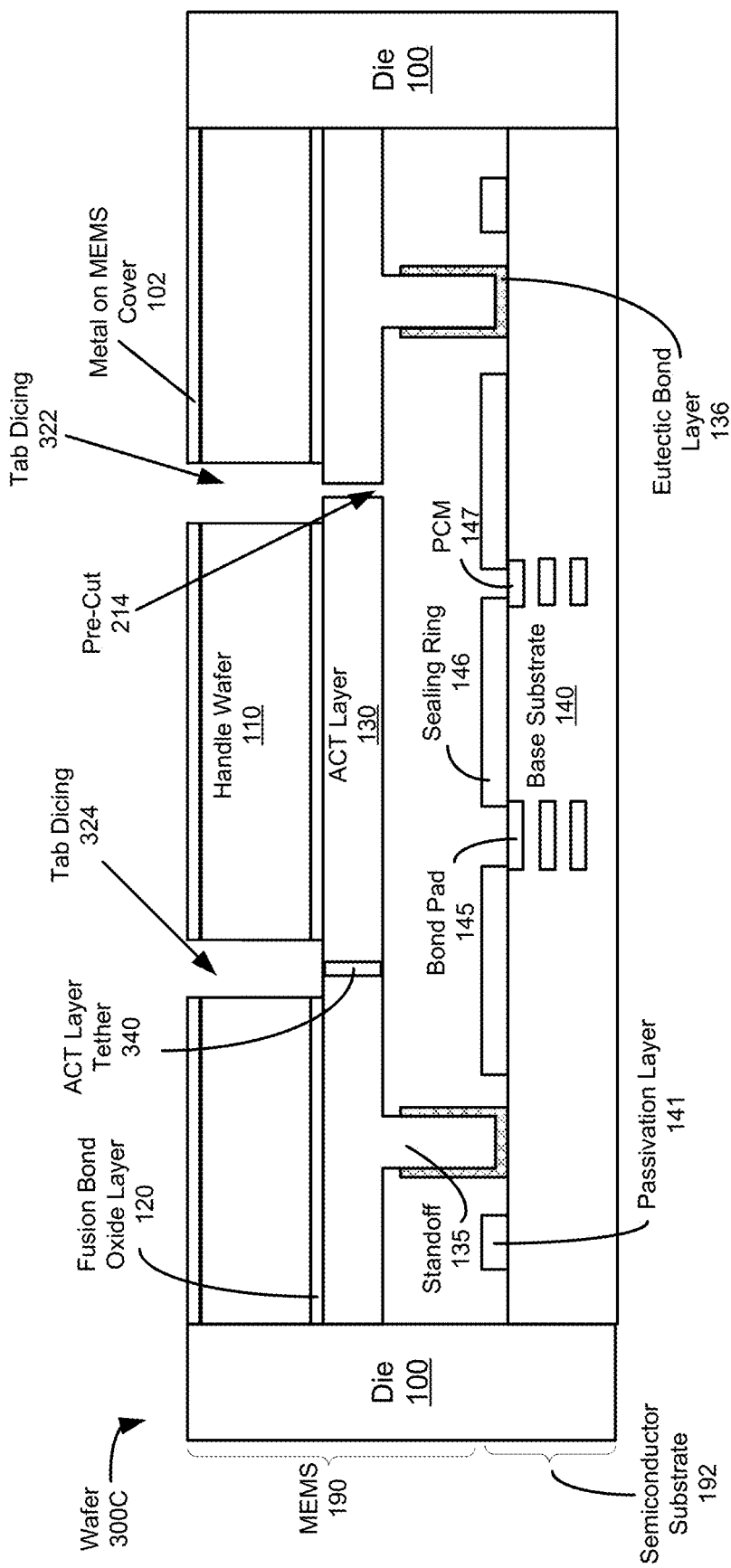

It is appreciated that the ACT layer pre-cut is formed during the MEMS wafer process. Referring now to FIG. 3B, wafer 300B is shown where tab dicing 322 is performed that cuts through a region of the MEMS wafer, e.g., the handle layer 110 as well as the fusion bond oxide layer 120 to reach the pre-cut 214. It is appreciated that the tab dicing 322 may be through blade sawing, plasma etch, DRIE process, etc. It is appreciated that the plasma etch process for tab dicing may be sequential plasma etch, e.g., metal such as AlCu etch, handle wafer layer etch (silicon) using DRIE, and fusion bond oxide etch, to reduce the width of the tab dicing in comparison to blade sawing. Referring now to FIG. 3C, a wafer 300C is shown where a tab dicing 324 is performed that cuts through a region of the MEMS wafer, e.g., the handle wafer 110 and the fusion bond oxide layer 120. In some embodiments, the tab dicing 324 also cuts partially through the ACT layer 130. However, it is appreciated that the ACT layer 130 that remains under the tab dicing 324 forms an ACT layer tether 340 that tethers the tab region the die 100. As such, unlike the conventional processes the tab is not released and as such damage to the surrounding areas are minimized. Moreover, the ACT layer tether 340 maintains the tab region in place weakly such that when the ACT layer tether 340 is broken the tab region is released without damaging the surrounding areas unlike the conventional process.

Figure 3D:
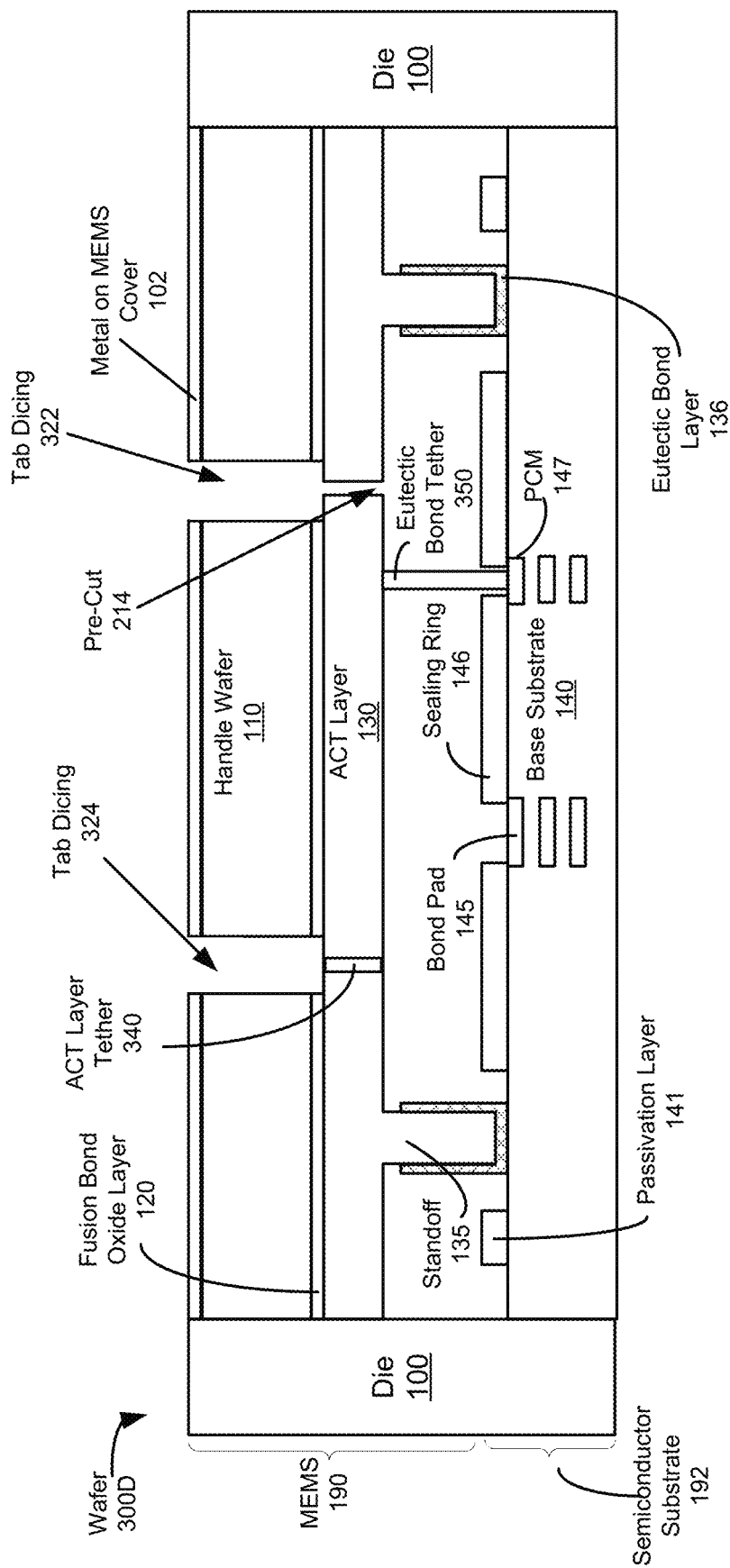

Referring now to FIG. 3D, a wafer 300D is shown that includes a eutectic bond tether 350. The eutectic bond tether 350 may structurally connect the ACT layer 130 of the tab region to the semiconductor tab region, e.g., to the PCM 147. Accordingly, in addition to the ACT layer tether 340, the eutectic bond tether 350 maintains the tab region in place and above the semiconductor tab region after the tab dicing 322 and 324. In other words, the tab region is not released after the dicing, thereby preventing the tab region from damaging the surrounding structures.

Figure 3E:
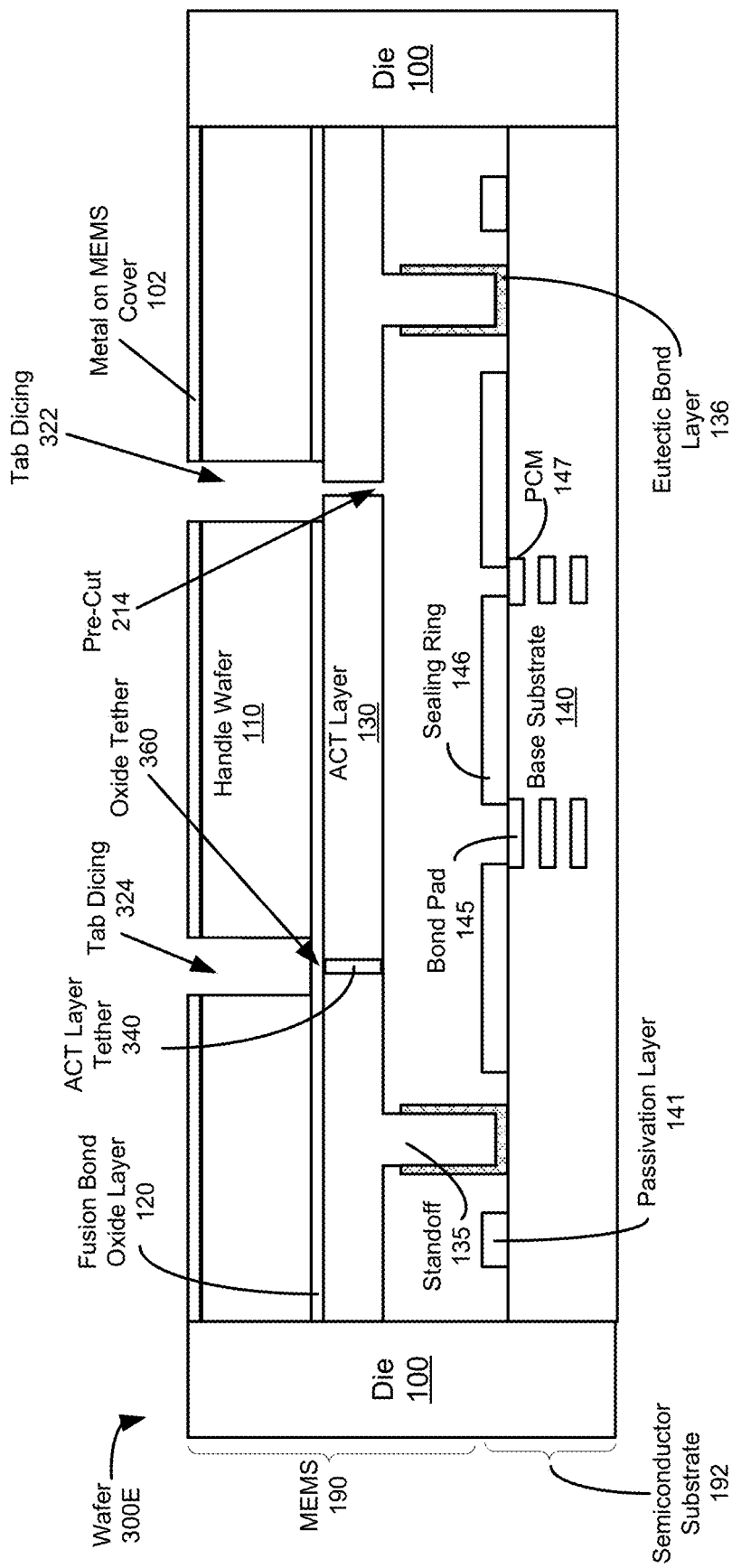

Referring now to FIG. 3E, a wafer 300E is shown where an oxide tether 360 is formed. For example, in some embodiments, the tab dicing 324 cuts through the handle wafer 110 but not through the fusion bond oxide layer 120, thereby leaving the oxide tether 360 in place (in this example positioned above the ACT layer tether 340). It is appreciated that the embodiments are described by forming the oxide tether 360 over the ACT layer tether 340 for illustrative purposes and should not be construed as limiting the scope of the embodiments. For example, the oxide tether 360 may be formed over the pre-cut 214 region in some embodiments. It is appreciated that the oxide tether 360 may be formed through a DRIE process and maintains the tab region in place and above the semiconductor tab region after tab dicing 322 and 324.

Figure 3F:
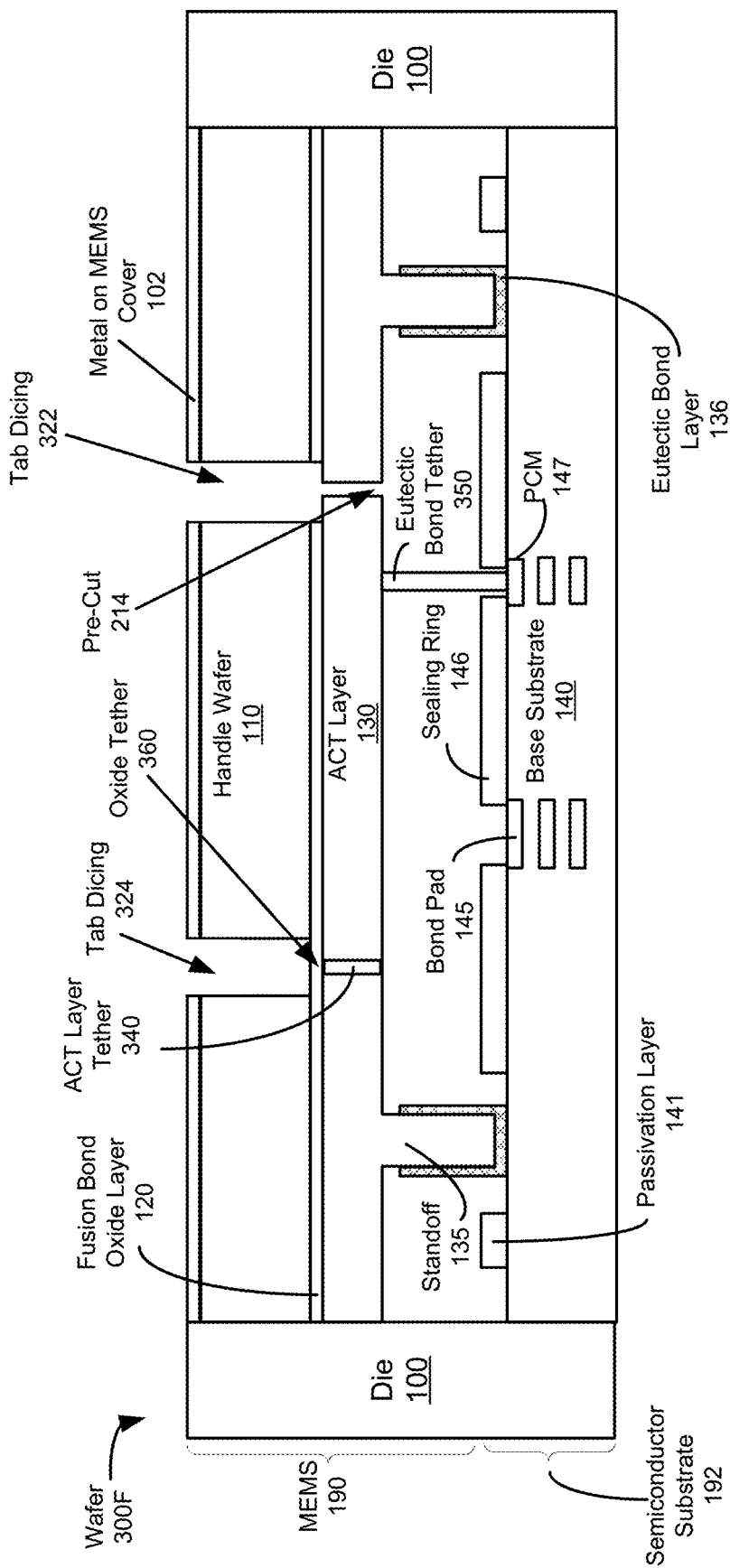

Referring now to FIG. 3F, a wafer 300F is shown that includes a combination of three tethers according to some embodiments. For example, the oxide tether 360, the ACT layer tether 340, and the eutectic bond tether 350 may all be used. It is appreciated that after the tether(s) are formed, the tab region may be removed, e.g., tape removal, vacuum pick, etc. It is appreciated that vacuum pick may be a process by which the tab is picked up using a vacuum suction machine. In other words, one or more tethers may structurally tether the tab region to the die and that the tab region is removed by breaking the one or more tethers.

Figure 4A:
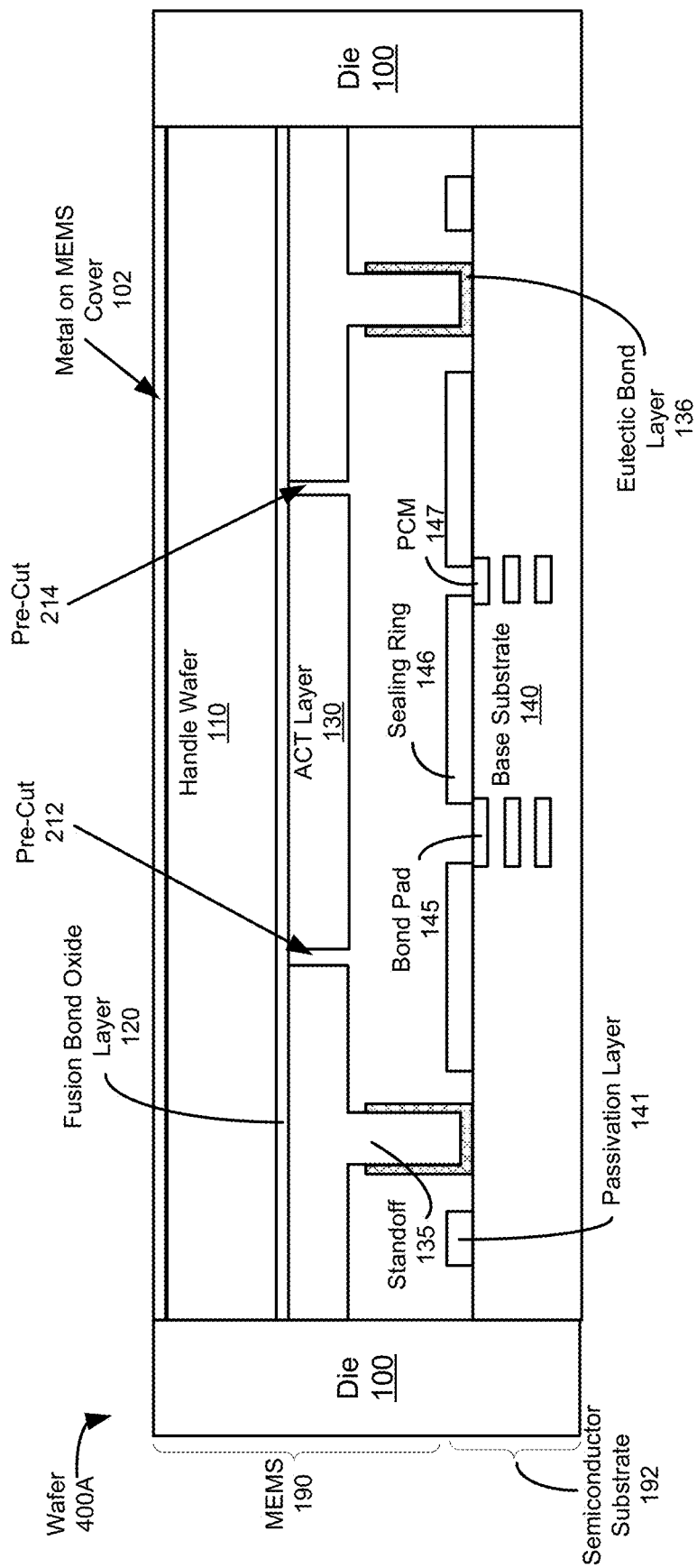
FIGS. 4A-4F show a tab removal process for a MEMS device using an oxide tether according to one aspect of the present embodiments.
Figure 4B:
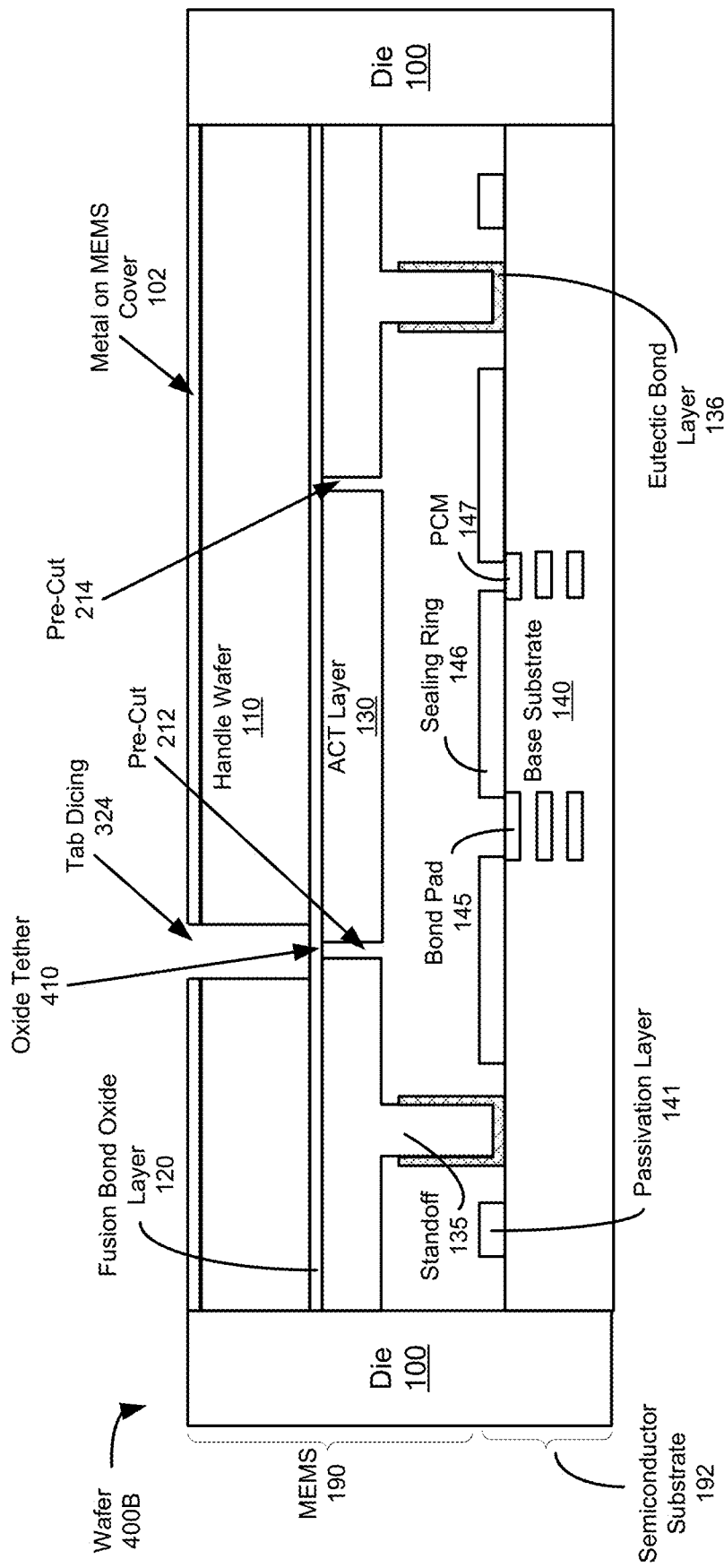
Figure 4C:
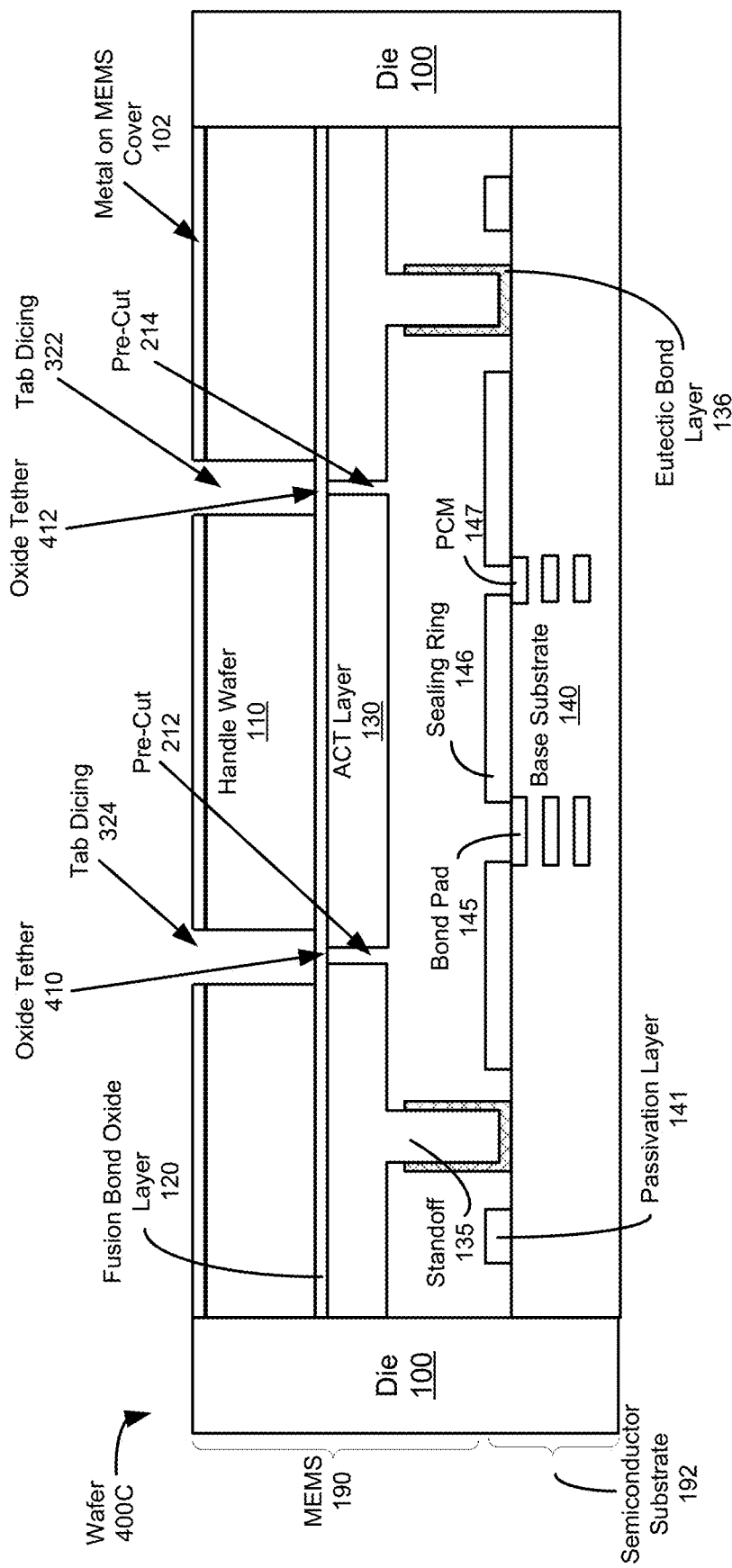
Figure 4D:
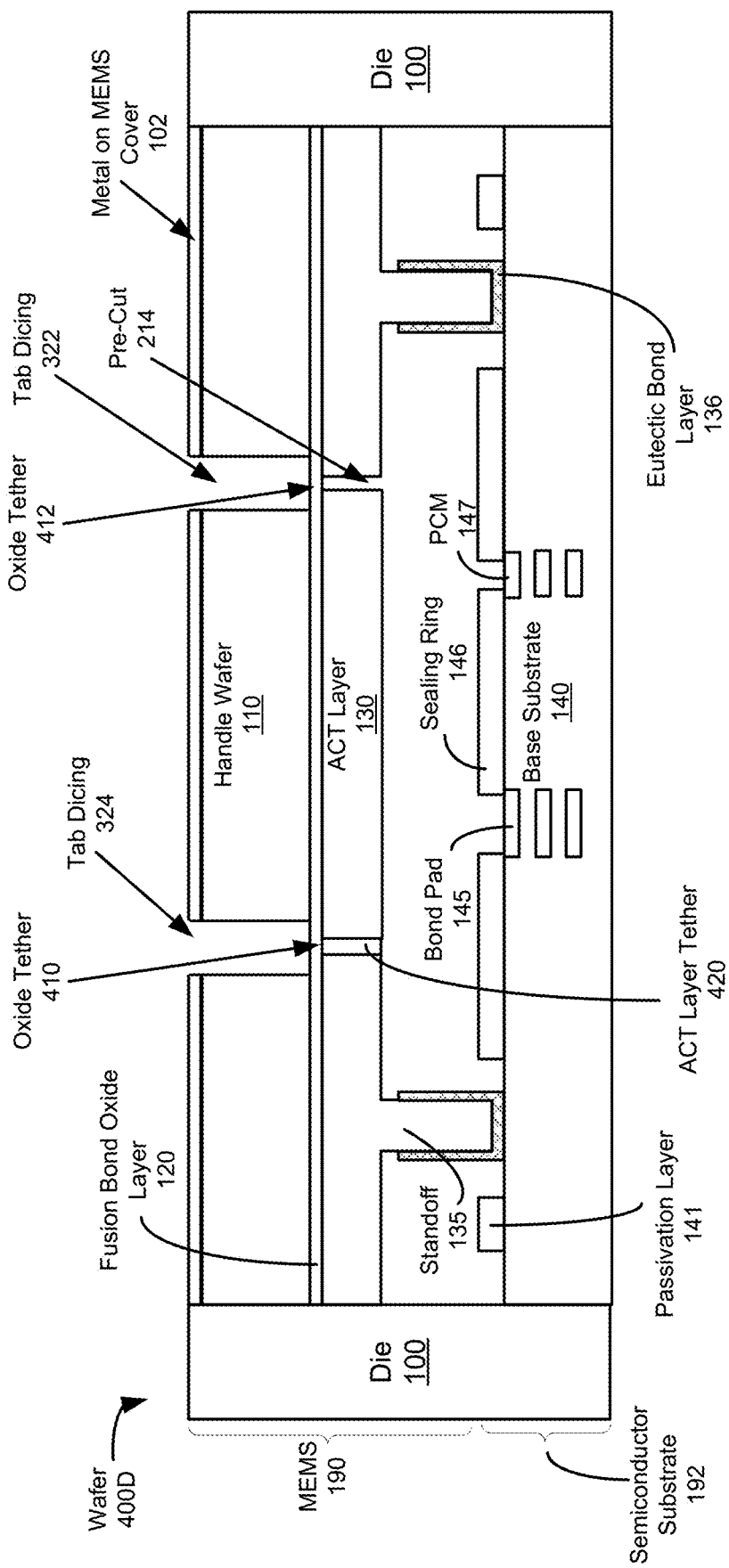
Figure 4E:
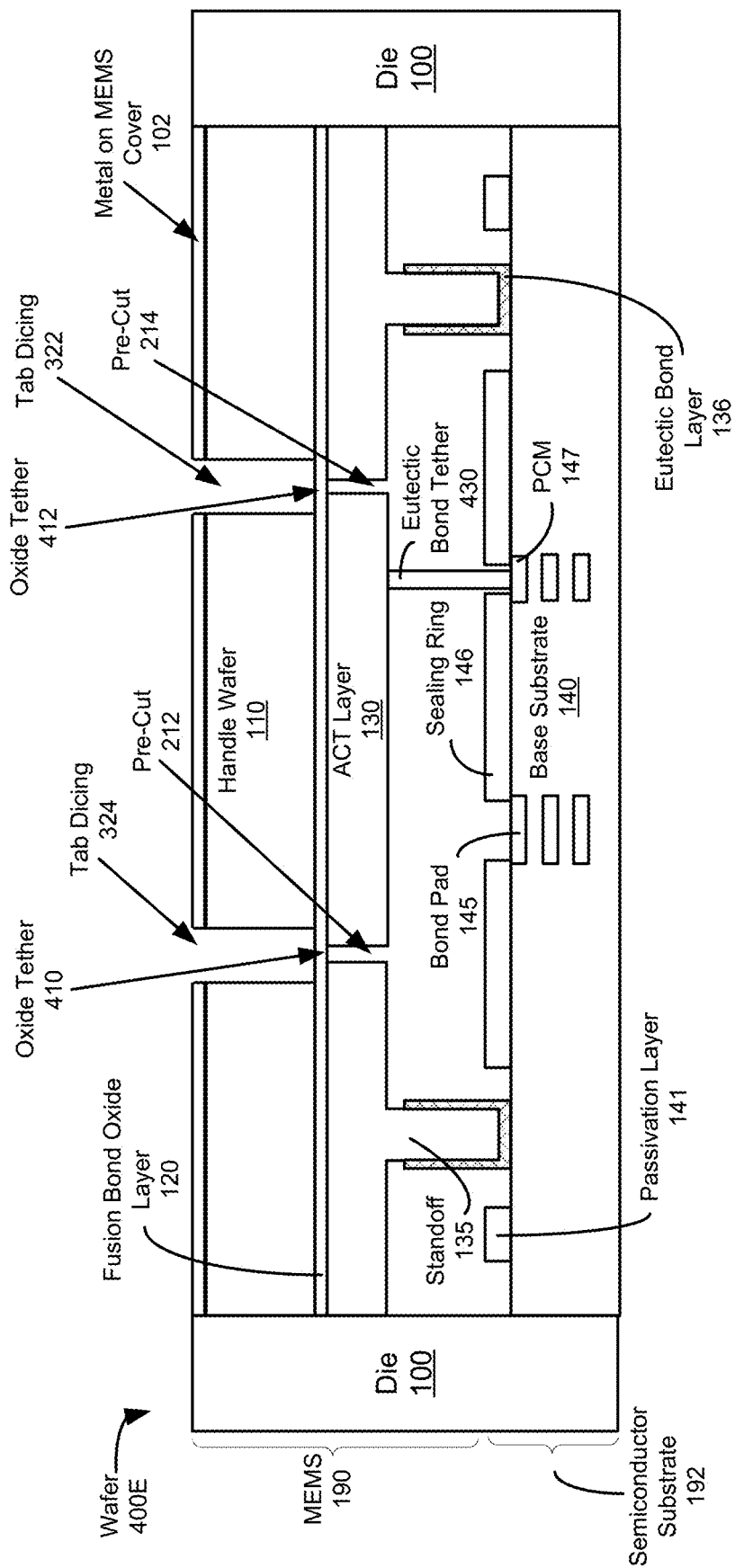
Figure 4F:
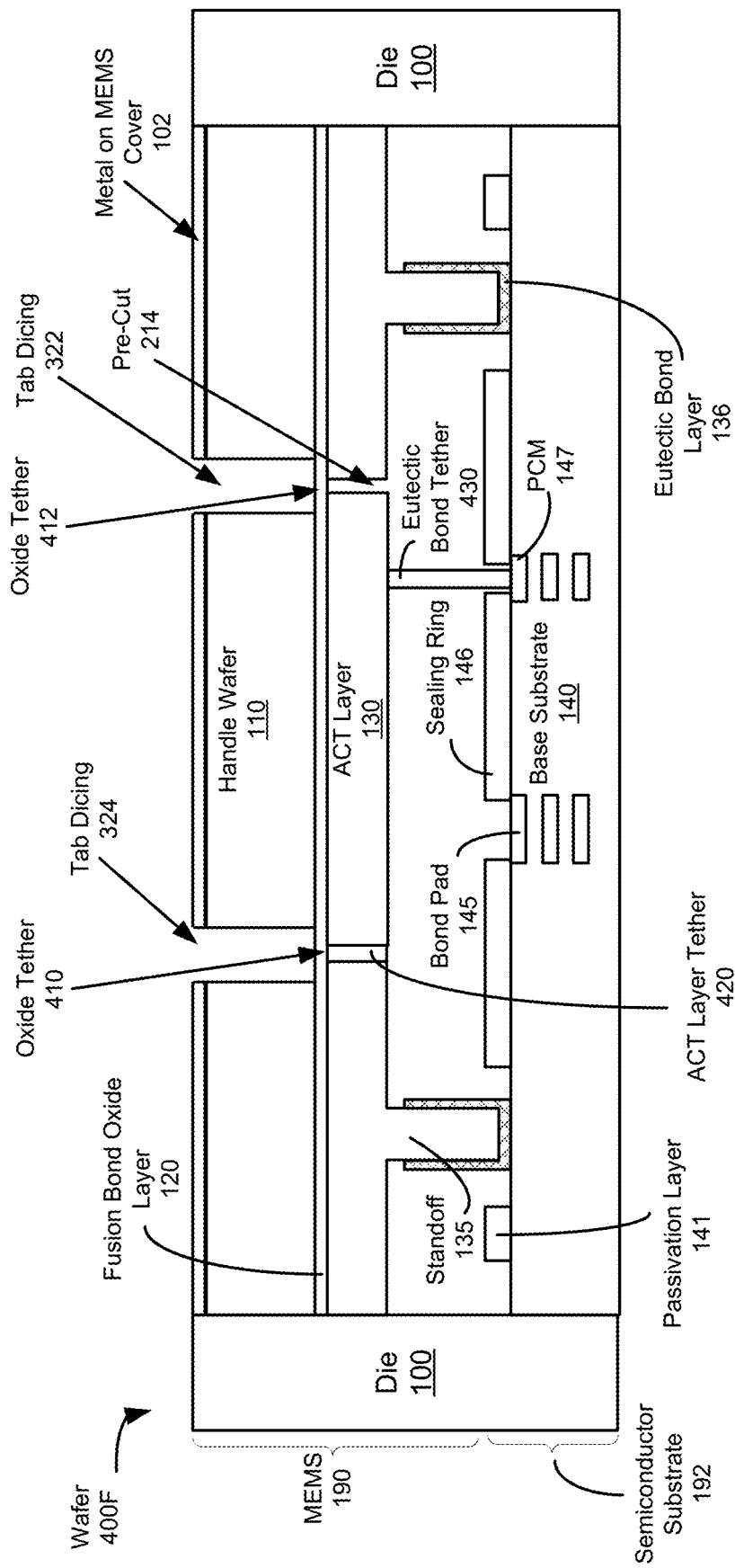

It is appreciated that FIGS. 3A-3F are described with the fusion bond oxide 120 coating the handle wafer 110 layer. It is appreciated that in some embodiments, the handle wafer 110 layer may have one or more cavities, such as cavities 502 and 504 of FIG. 5A therein, e.g., corresponding to the pre-cut 214 as an example, corresponding to where the ACT layer tether 340, corresponding to the oxide tether 360, etc. In some embodiments, the cavity in the handle wafer 110 may be formed in combination with one or more pre-cuts in the ACT layer 130. According to one nonlimiting example, during the tab dicing process the handle wafer 110 is cut through (not the full thickness) as well as cutting through the fusion bond oxide layer 120 because of the cavity within the handle wafer 110. In other words, the cuts being made at locations where the handle wafer 110 has a cavity therein results in the cut being made in those locations while the cuts do not go through the full thickness of the handle wafer 110 elsewhere. In some embodiments, the tab dicing may cut the handle wafer 110 through but not completely the fusion bond oxide layer 120 where the cavity within the handle wafer 110 is positioned, thereby forming the oxide tether 360. In contrast, if the fusion bond oxide layer 120 is cut through but not the ACT layer 130, then the ACT layer tether 340 is formed where the cavity within the handle wafer 110 is positioned. In other words, the fusion bond oxide layer 120 forms an enclosed cavity over the ACT layer tether 340 prior to the tab dicing the second region of the tab region FIGS. 4A-4F show a tab removal process for a MEMS device using an oxide tether according to one aspect of the present embodiments. FIGS. 4A-4F are similar to that of FIGS. 3A-3F above and the structural embodiments described in FIG. 4A-4F are similar and description of those structures are not duplicated for clarity. FIG. 4A includes a wafer 400A that is similar to that of FIG. 2A. It is appreciated, that as described above the semiconductor tab region includes a bond pad that is positioned outside of a eutectic bond seal ring prior to the tab dicing process. It is appreciated that the embodiment is described with two pre-cuts for illustrative purposes that should not be construed as limiting the scope of the embodiments. For example, any number of pre-cuts may be used. Referring now to FIG. 4B, a wafer 400B is shown after tab dicing 324 that corresponds to the pre-cut 212 region. The tab dicing 324 may be similar to the tab dicing, as described above. The tab dicing 324 cuts through the handle wafer 110 but leaves all or a portion of the fusion bond oxide layer 120 that forms the oxide tether 410. Referring now to FIG. 4C, a wafer 400C is shown after tab dicing 322 that corresponds to the pre-cut region 214. The tab dicing 322 may be similar to the tab dicing that was described above. The tab dicing 322 cuts through the handle wafer 110 but leaves all or a portion of the fusion bond oxide layer 120 that forms the oxide tether 412. Referring now to FIG. 4D, a wafer 400D may include one pre-cut 214 instead of two. As such, an ACT layer tether 420 may be formed under the oxide tether 410. Referring now to FIG. 4E, a wafer 400E is shown that is similar to that of FIG. 4C but that a eutectic bond tether 430 is also formed, as described above. Referring now to FIG. 4F, a wafer 400F is shown that shows a combination of ACT layer tether 420, the oxide tether 410, and the eutectic bond tether 430. It is appreciated that the tethers or any combination thereof maintains and holds the tab region in place subsequent to the tab dicing process, thereby preventing the tab region from damaging the structural areas as it is removed. It is appreciated that the tab region is subsequently removed, as described with respect to FIGS. 3A-3F. It is appreciated that as described above, the handle wafer 110 layer may have one or more cavities such as cavities 502 and 504 of FIG. 5A therein. As such, the embodiments of FIGS. 4A-4F are equally applicable to a handle wafer 110 including cavities therein and where the tether(s) are formed as described above with respect to FIGS. 4A-4F.

Figure 5A:
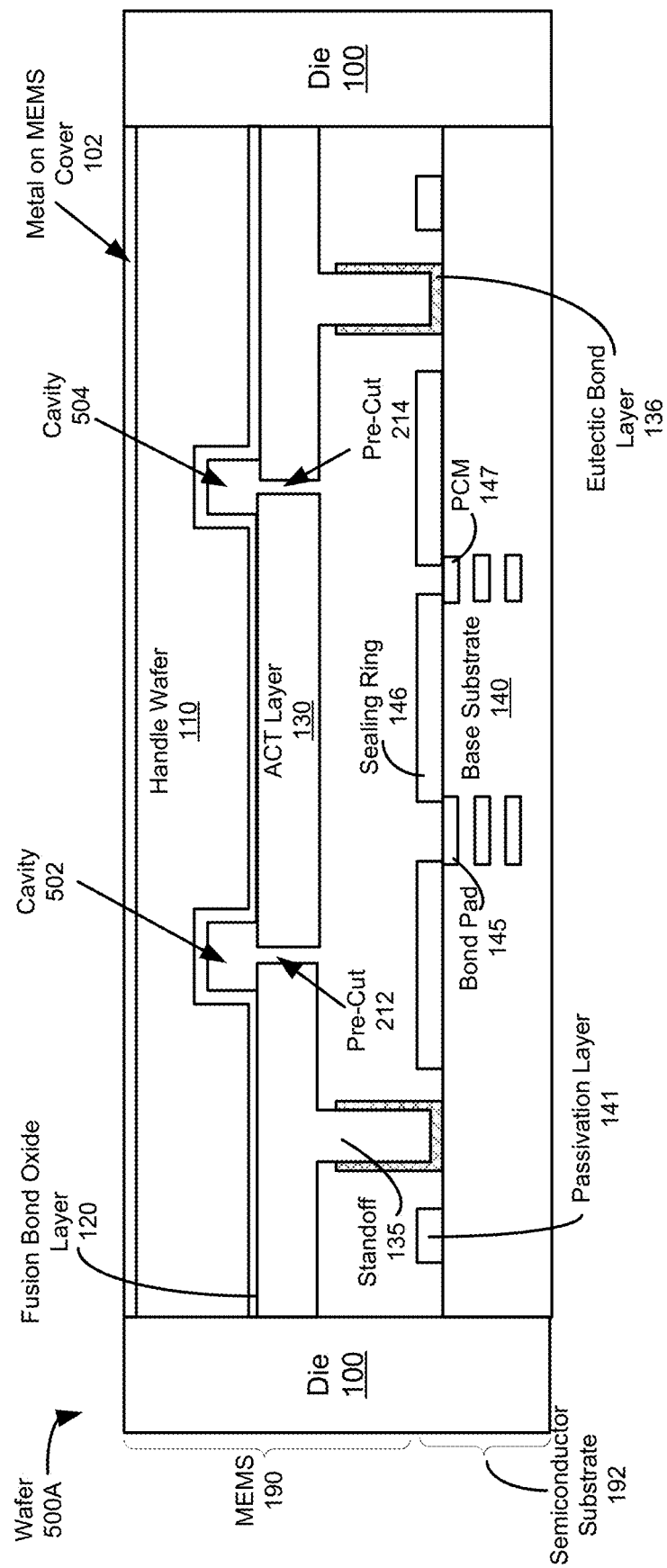
FIGS. 5A-5F show another tab removal process for a MEMS device using an oxide tether according to one aspect of the present embodiments.
Figure 5B:
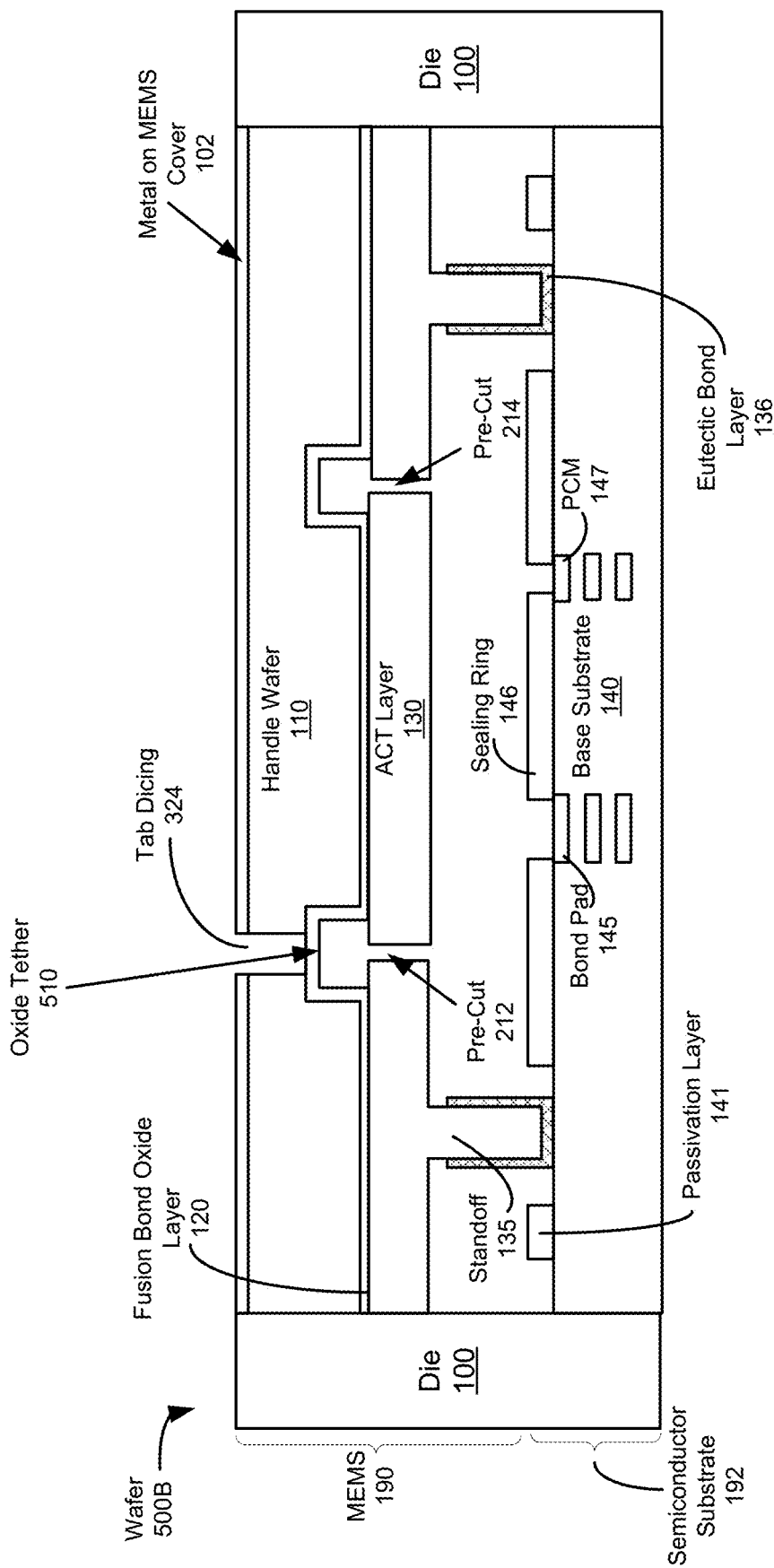
Figure 5C:
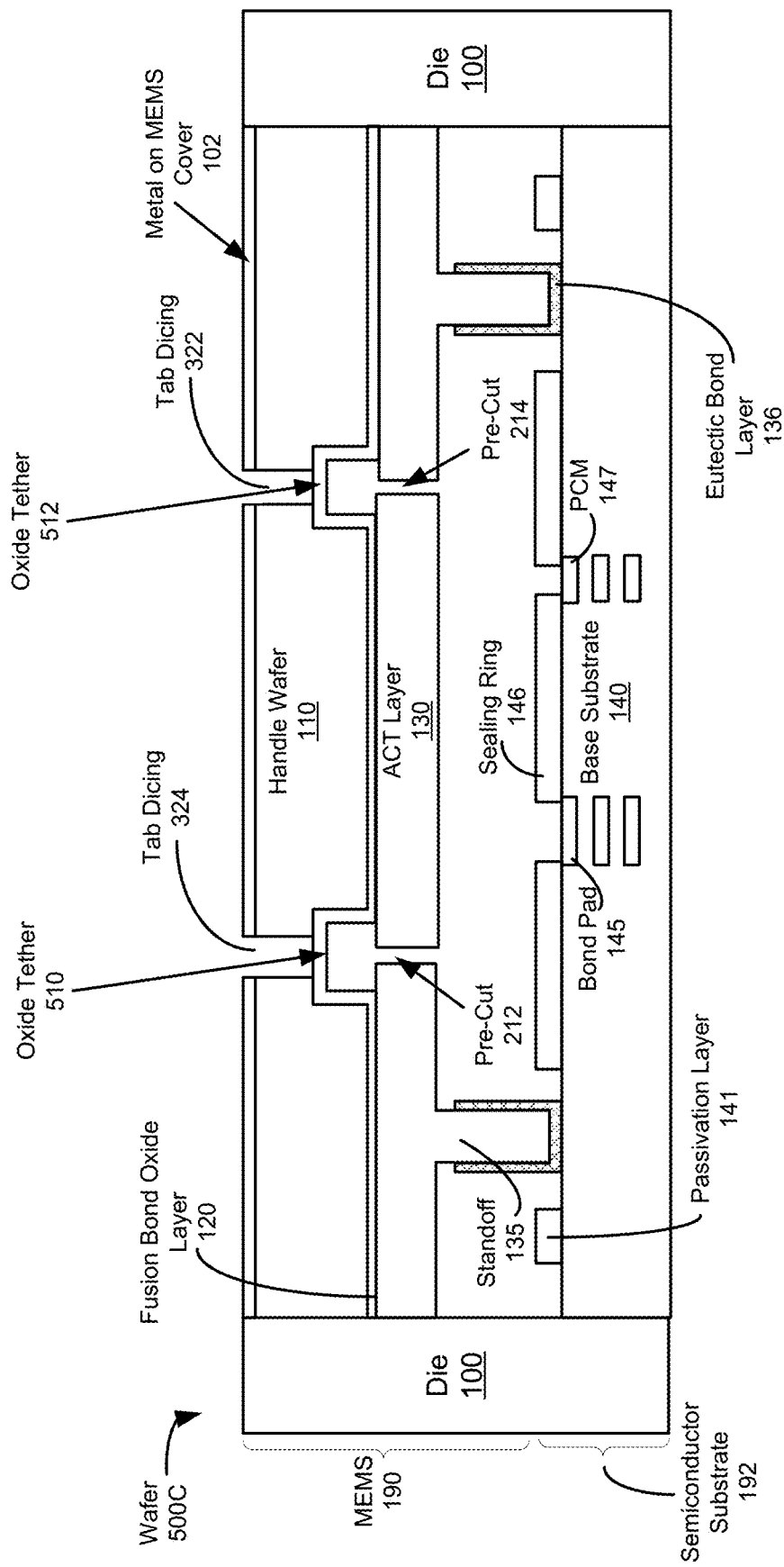
Figure 5D:
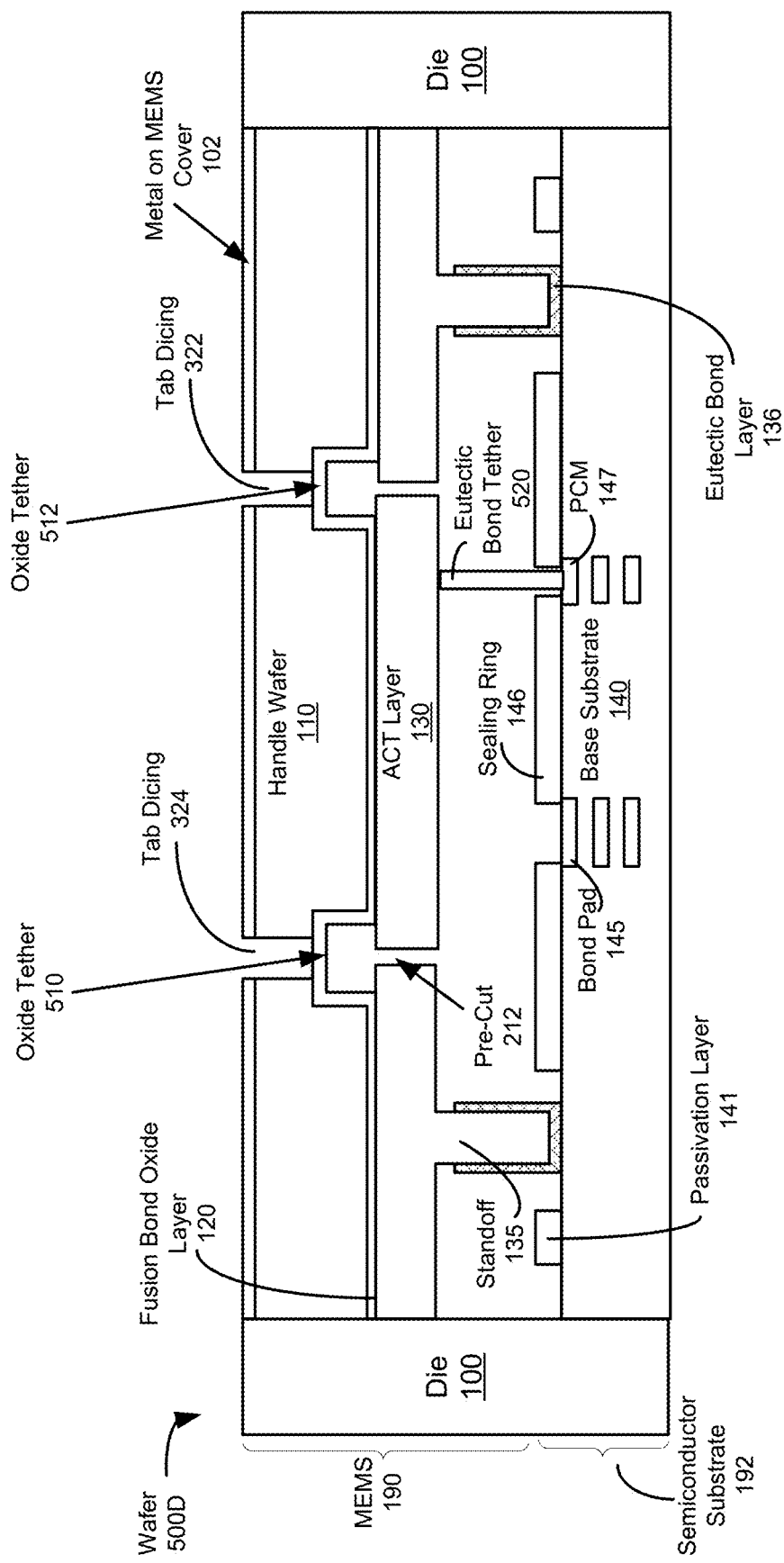
Figure 5E:
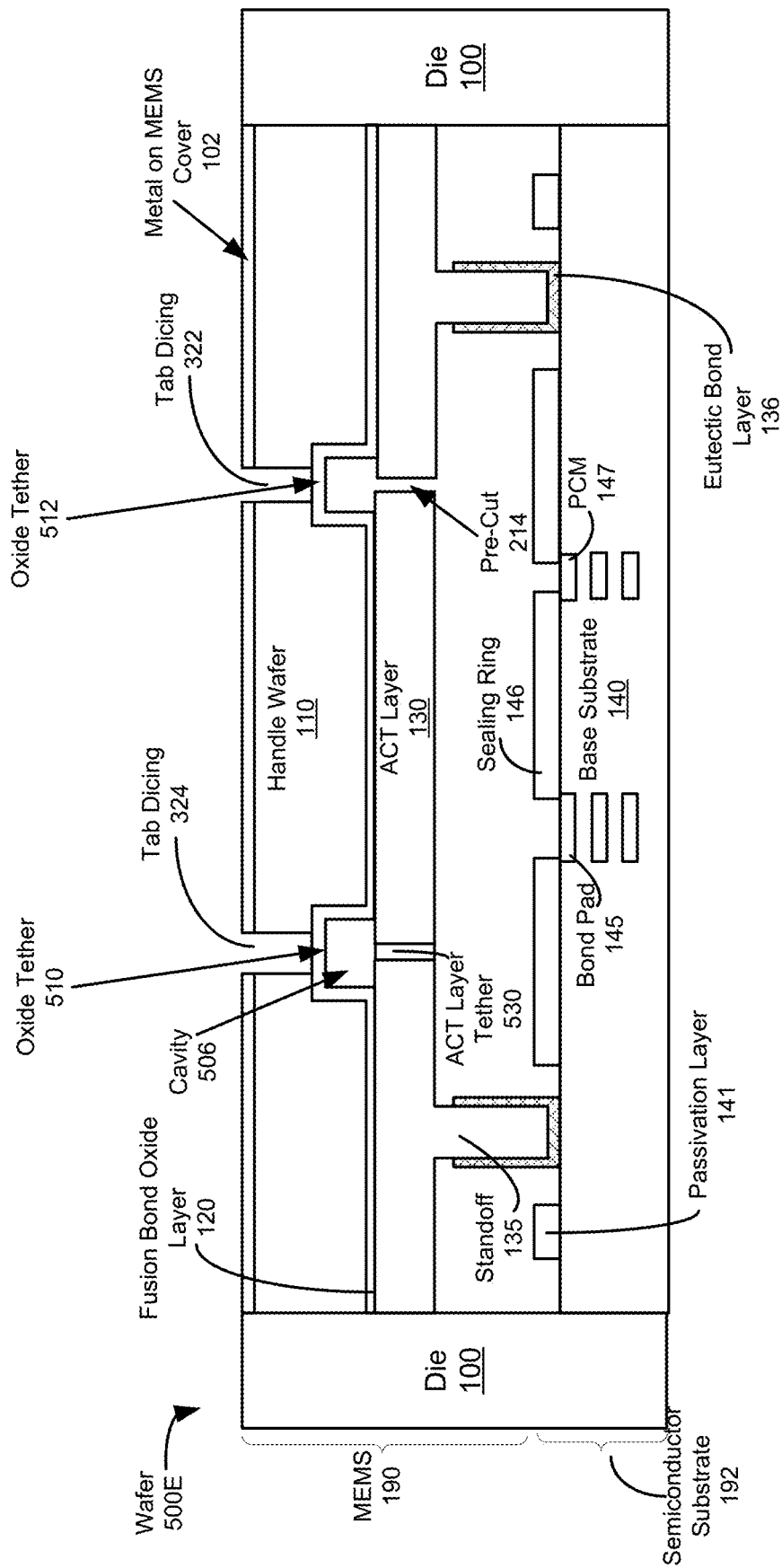
Figure 5F:
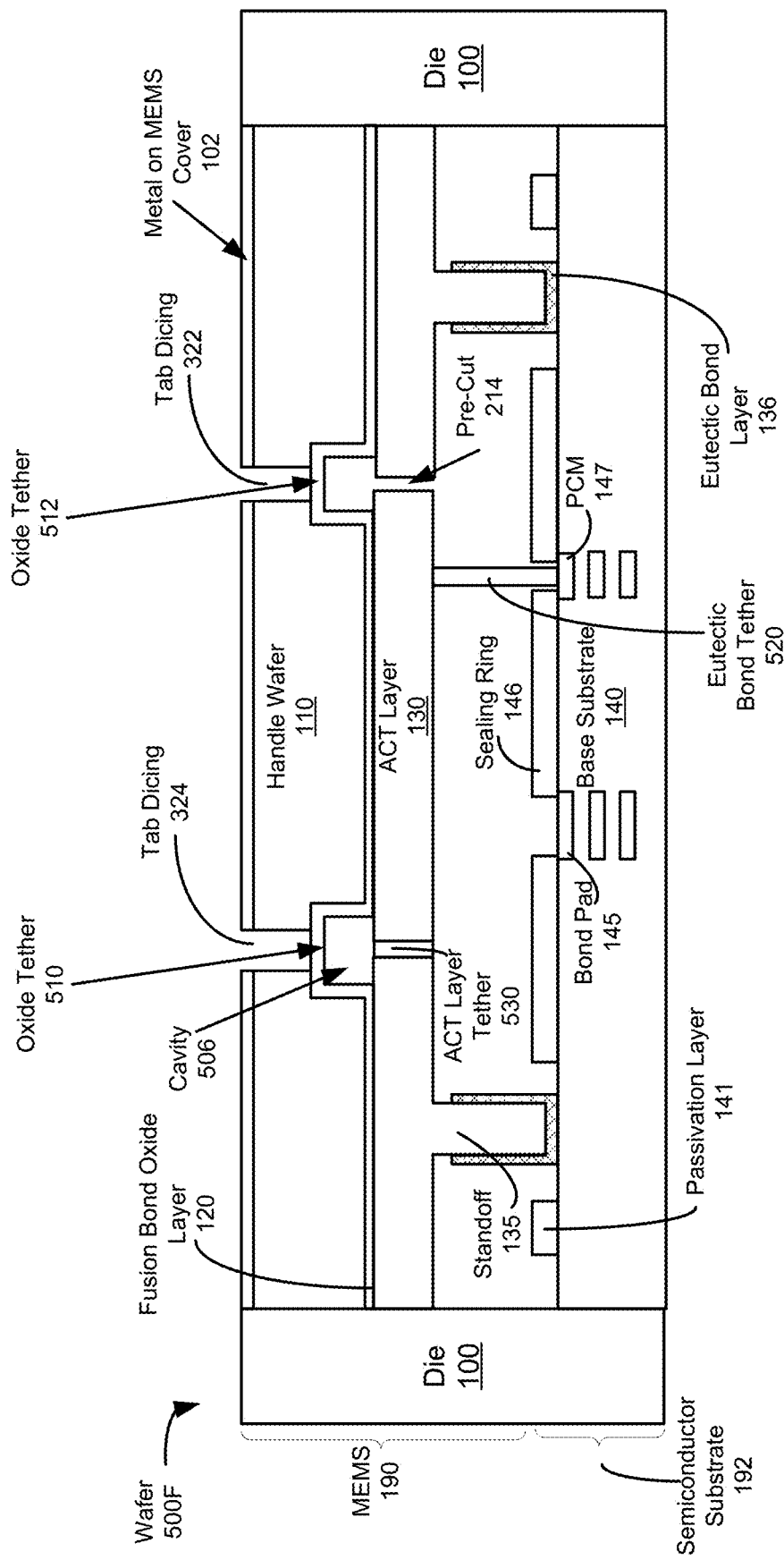

FIGS. 5A-5F show another tab removal process for a MEMS device using an oxide tether according to one aspect of the present embodiments. FIGS. 5A-5F are similar to that of FIGS. 3A-3F above and the structural embodiments described in FIG. 5A-5F are similar and description of those structures are not duplicated for clarity. FIG. 5A shows a wafer 500A that is similar to that of FIG. 2A except that the handle wafer 110 includes cavities 502 and 504 that correspond to the pre-cuts 212 and 214 respectively. As illustrated the cavities 502 and 504 are coated with the fusion bond oxide layer 120. Referring now to FIG. 5B, a wafer 500B is shown after the tab dicing 324 process that cuts through the handle wafer 110 portion corresponding to the cavity 502. It is appreciated that the tab dicing 324 leaves at least a portion of the fusion bond oxide layer 120 in place that forms the oxide tether 510. As described above, the tether that is formed tethers the tab portion to the die 100 and maintains it above the semiconductor tab portion even after the tab dicing process until the tab is removed, e.g., tape removal, vacuum pick, etc. Referring now to FIG. 5C, a wafer 500C is shown where an oxide tether 512 is formed over cavity 504 within the handle wafer 110 after tab dicing 322 process. The oxide tether 512 is substantially similar to that of oxide tether 510, as described above. Referring now to FIG. 5D, a wafer 500D is shown similar to the wafer 500C except that in this embodiment, a eutectic bond tether 520 is also formed that structurally connects the tab region to the semiconductor tab region. In one nonlimiting example, the eutectic bond tether 520 connects the ACT layer 130 of the tab region to the PCM 147 of the semiconductor tab region. A wafer 500E of FIG. 5E is similar to that of FIG. 5C except that in this embodiment instead of having two pre-cuts one pre-cut is used. For example, pre-cut 214 is present while instead of having pre-cut 212 an ACT layer tether 530 is formed that is positioned at the bottom of the enclosed cavity 506 and underneath the oxide tether 510. Referring now to FIG. 5F, a wafer 500F is illustrated similar to that of FIG. 5E except that an additional tether, e.g., a eutectic bond tether 520 is also formed that structurally connects the tab region to the semiconductor tab region. It is appreciated that the tab region is subsequently removed, as described with respect to FIGS. 3A-3F.

Figure 6A:
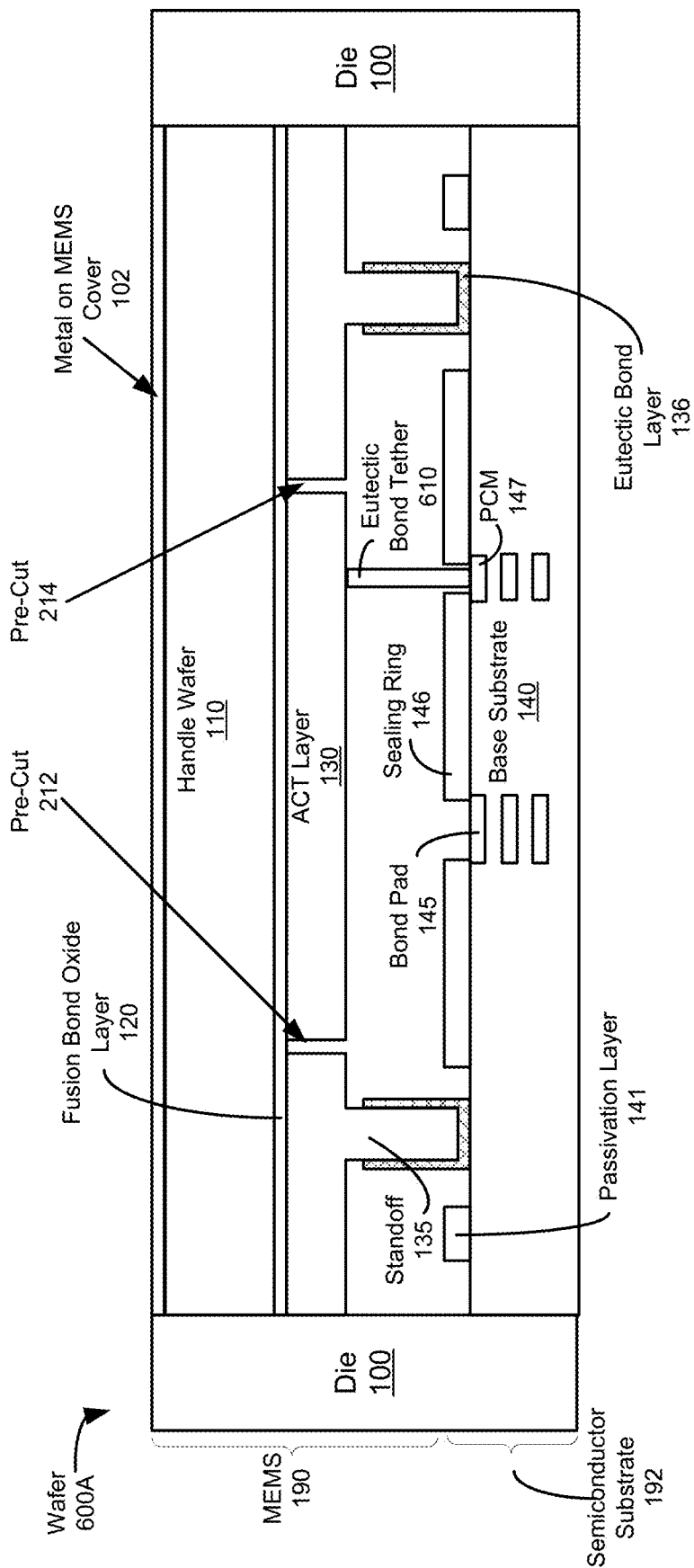
FIGS. 6A-6E show a tab removal process using a eutectic bond tether according to one aspect of the present embodiments.
Figure 6B:
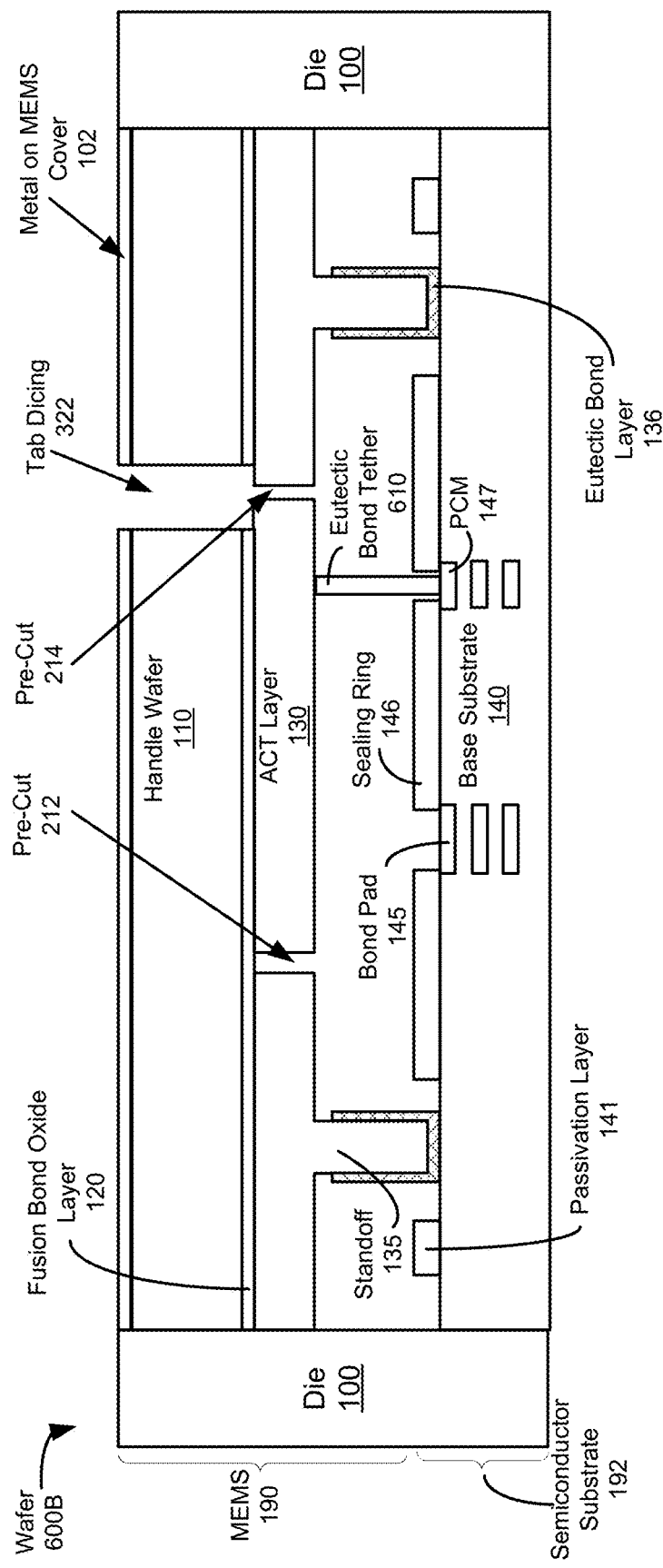
Figure 6C:
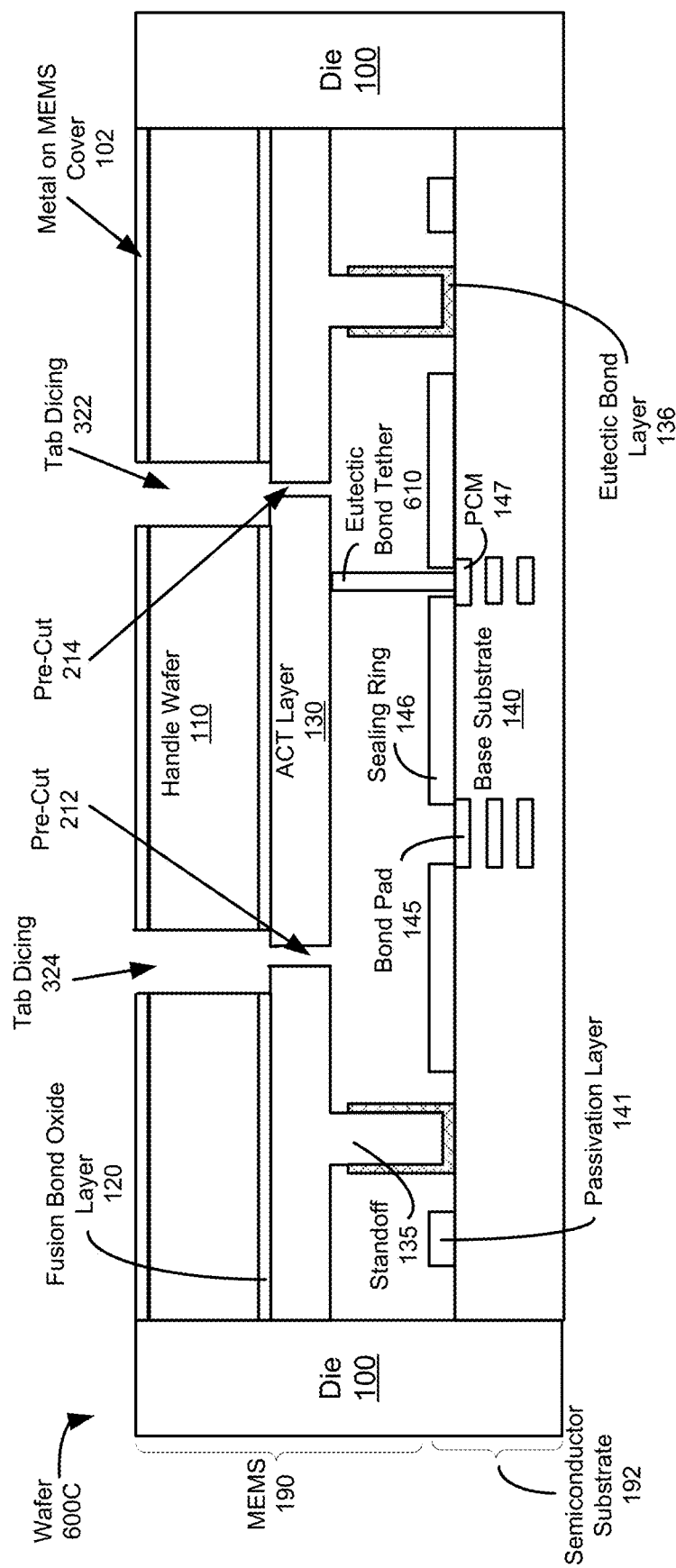
Figure 6D:
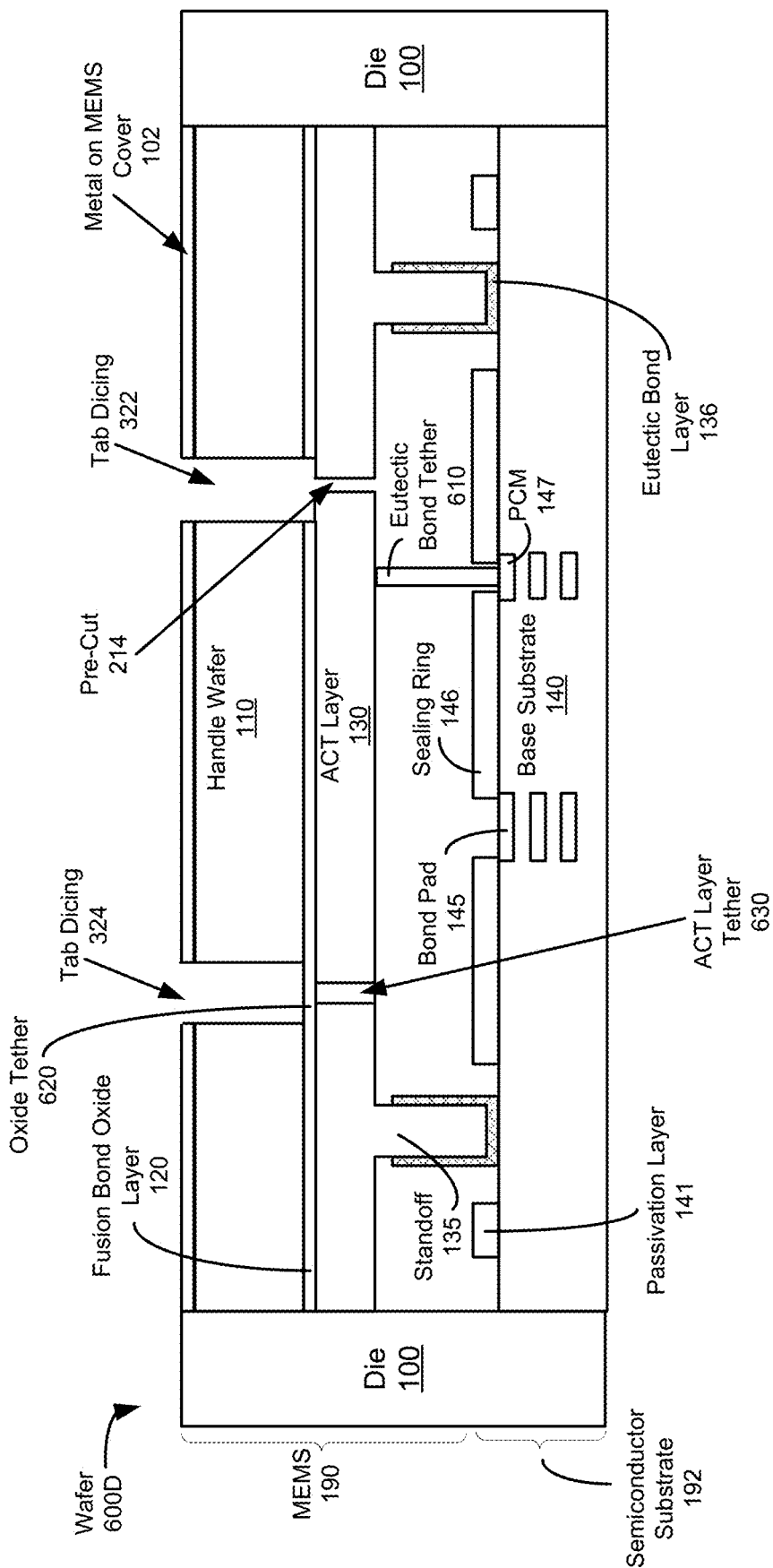
Figure 6E:
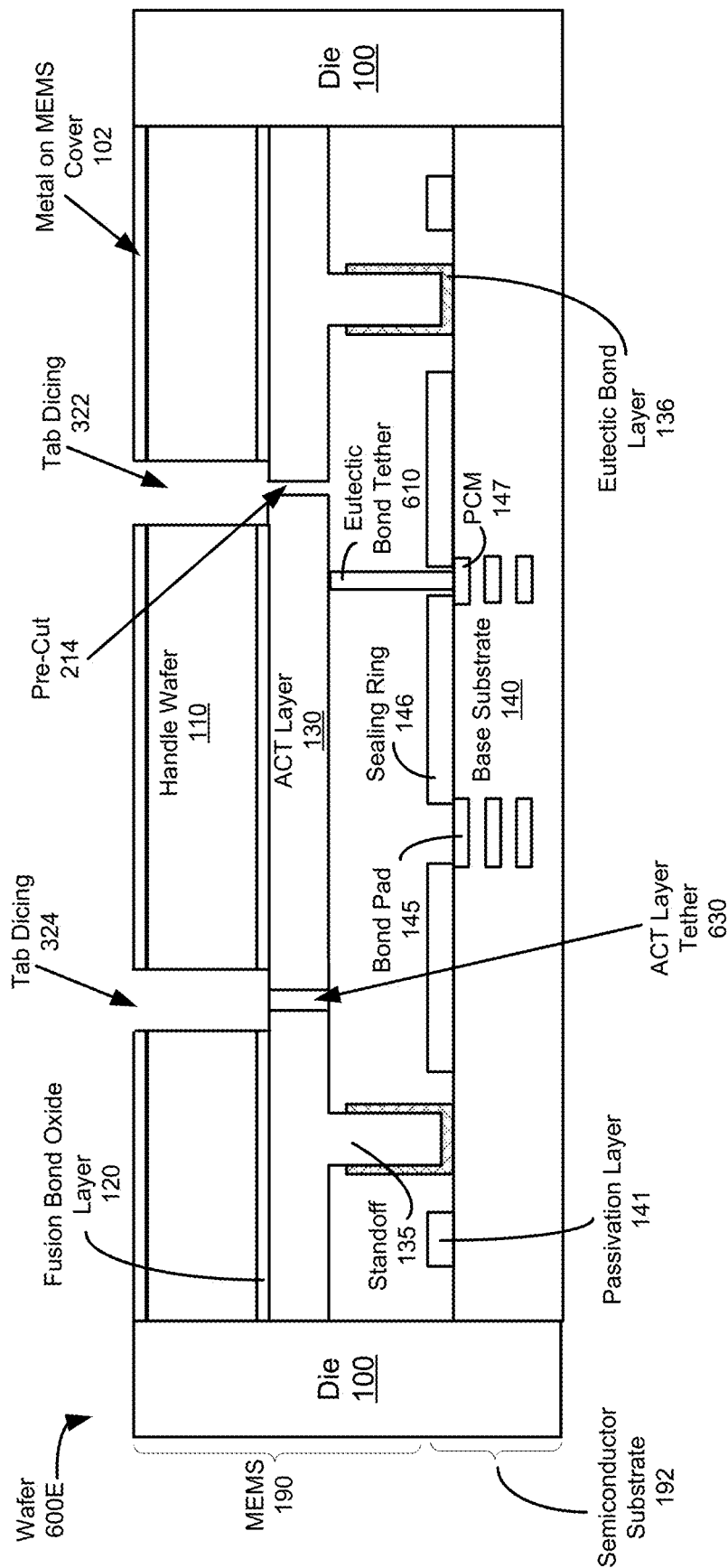

FIGS. 6A-6E show a tab removal process using a eutectic bond tether according to one aspect of the present embodiments. FIGS. 6A-6E are similar to that of FIGS. 3A-3F above and the structural embodiments described in FIG. 6A-6E are similar and description of those structures are not duplicated for clarity. Referring to FIG. 6A, a wafer 600A is shown with two pre-cuts 212 and 214. The eutectic bond tether 610 is also formed, similar to other eutectic bond tether as described above, to structurally connect the tab region to the semiconductor tab region and to prevent the tab region from being removed during the tab dicing process, as described above. For example, as illustrated in FIG. 6B, the wafer 600B includes the eutectic bond tether 610 that holds the tab region connected with the die 100 after the tab dicing 322 process. Referring now to FIG. 6C, a wafer 600C is shown after the tab dicing 324 and where the tab region is held in place with the eutectic bond tether 610 only. Referring now to FIG. 6D, a wafer 600D is shown where in addition to the eutectic bond tether 610, an oxide tether 620 and the ACT layer tether 630 are also formed, as described above. Referring to FIG. 6E, a wafer 600E is shown using two tethers to hold the tab region in place and connected to the die 100 after the tab dicing process. For example, a combination of the eutectic bond tether 610 and the ACT layer tether 630 may be used to hold the tab region in place after the tab dicing 322 and 324 process. The tab region may subsequently be removed, as described above.

Figure 7A:
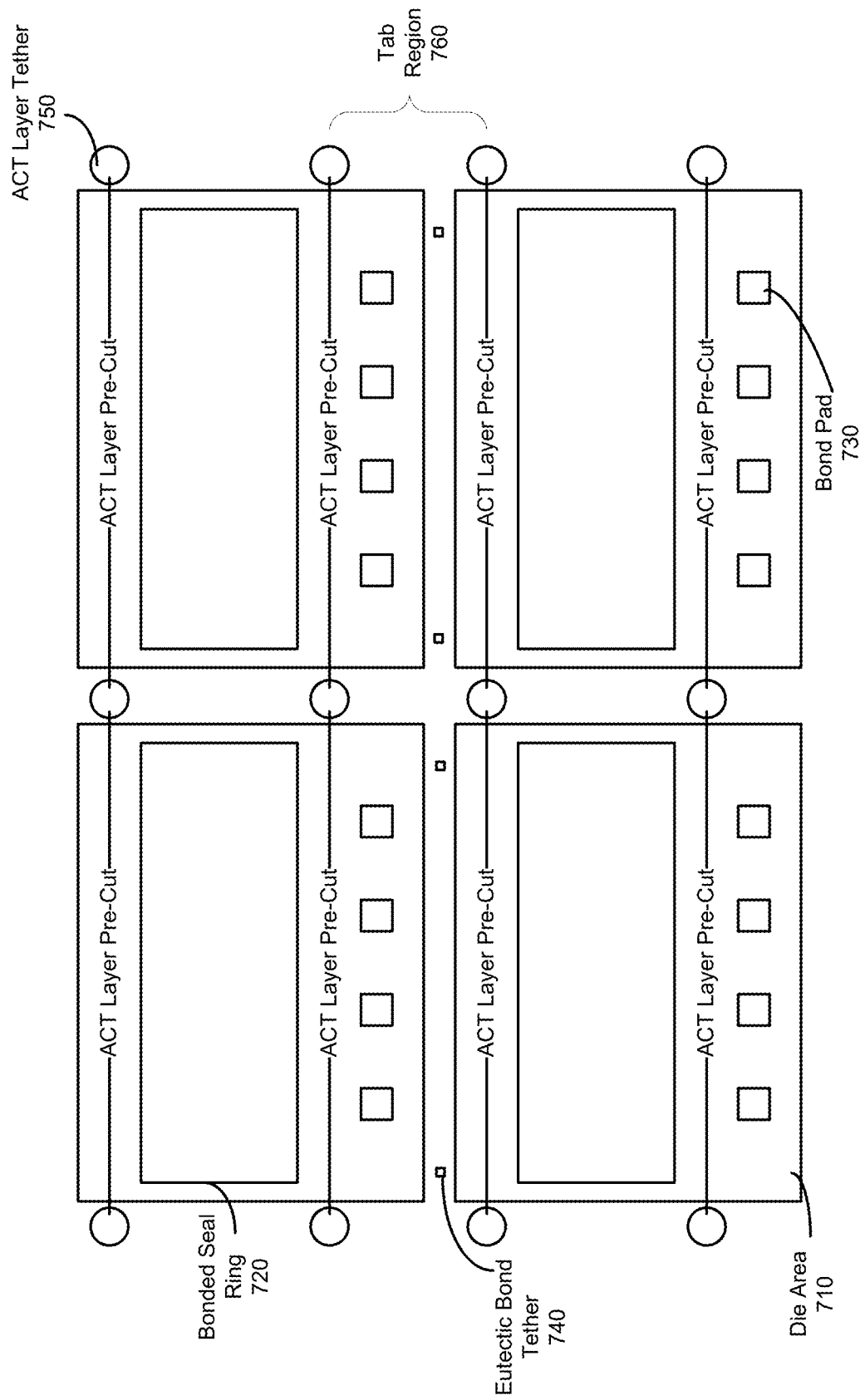
FIGS. 7A-7B show tab dicing for a MEMS device according to one aspect of the present embodiments.
Figure 7B:
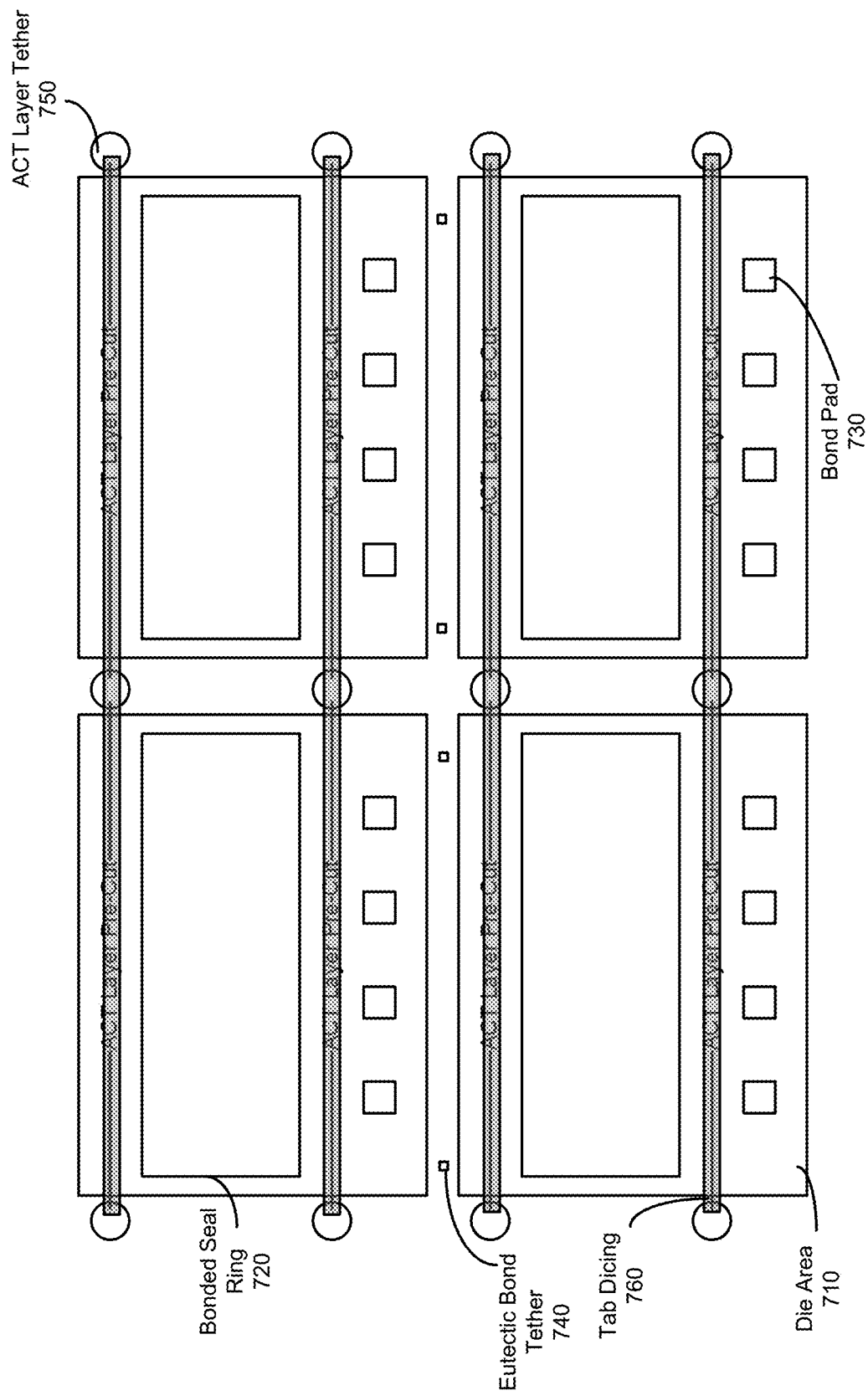

FIGS. 7A-7B show tab dicing for a MEMS device according to one aspect of the present embodiments. Referring to FIG. 7A, a top view of the MEMS device including the tab region 760. As illustrated, each die area 710 of the MEMS device may include a plurality of ACT layer pre-cuts (here in horizontal direction and discontinuous) and include a bonded seal ring 720. The plurality of ACT layer pre-cuts may form a plurality of ACT layer tethers 750 between the dies, as described above. In some embodiments, one or more eutectic bond tethers 740 may also be formed within the tab region 760, as described above. Moreover, bond pads 730 are the bond pads of the semiconductor that are in the semiconductor tab region, as described above. As illustrated in FIG. 7B, the pre-cut areas go through a tab dicing process that results in the tab region being held in place using the one or more tethers, as described above until the tab region is subsequently removed. It is appreciated that additional tethers may also be used, e.g., oxide tether as described above but not shown in FIGS. 7A-7B.

Figure 8A:
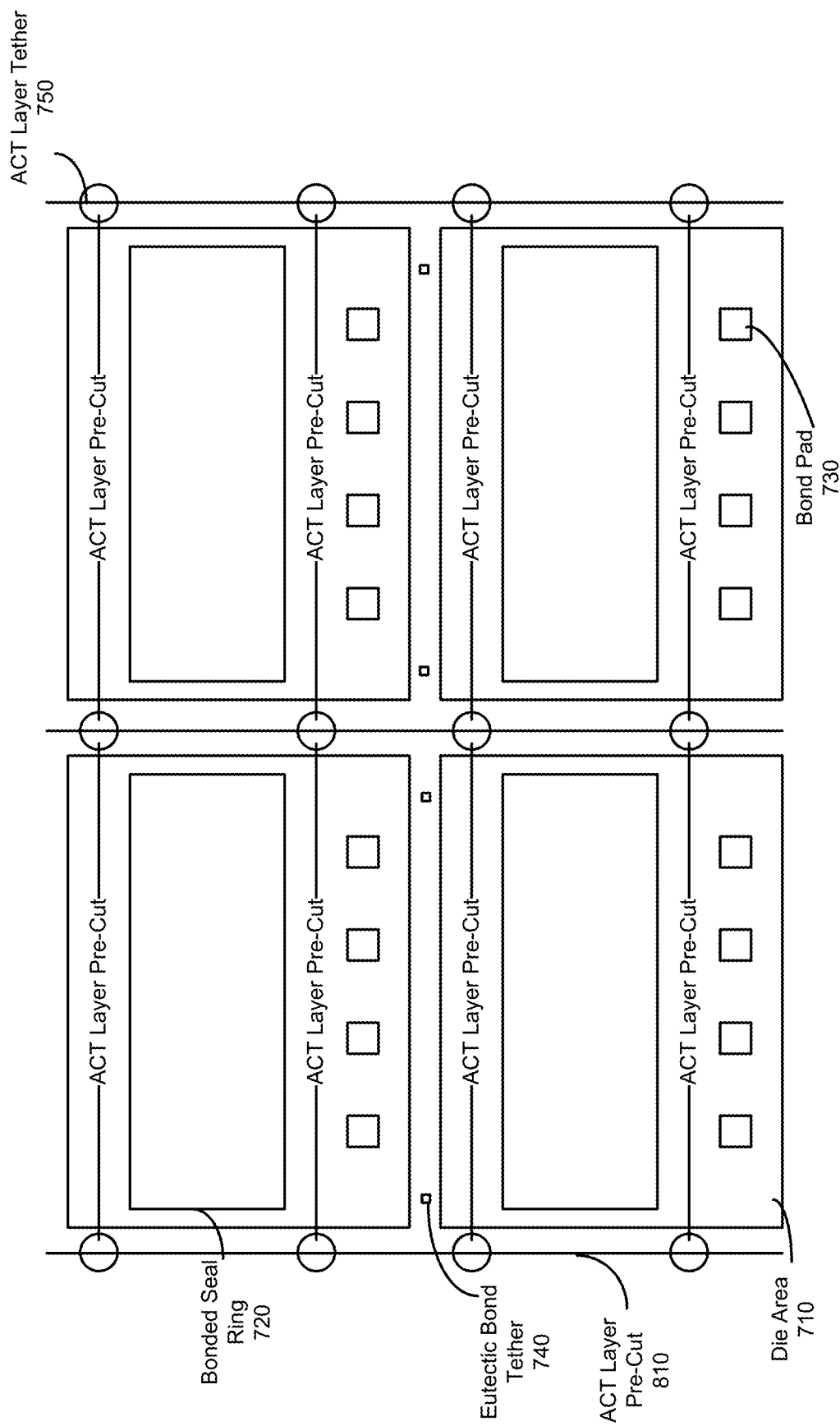
FIG. 8A-8B show another tab dicing for a MEMS device according to one aspect of the present embodiments.
Figure 8B:
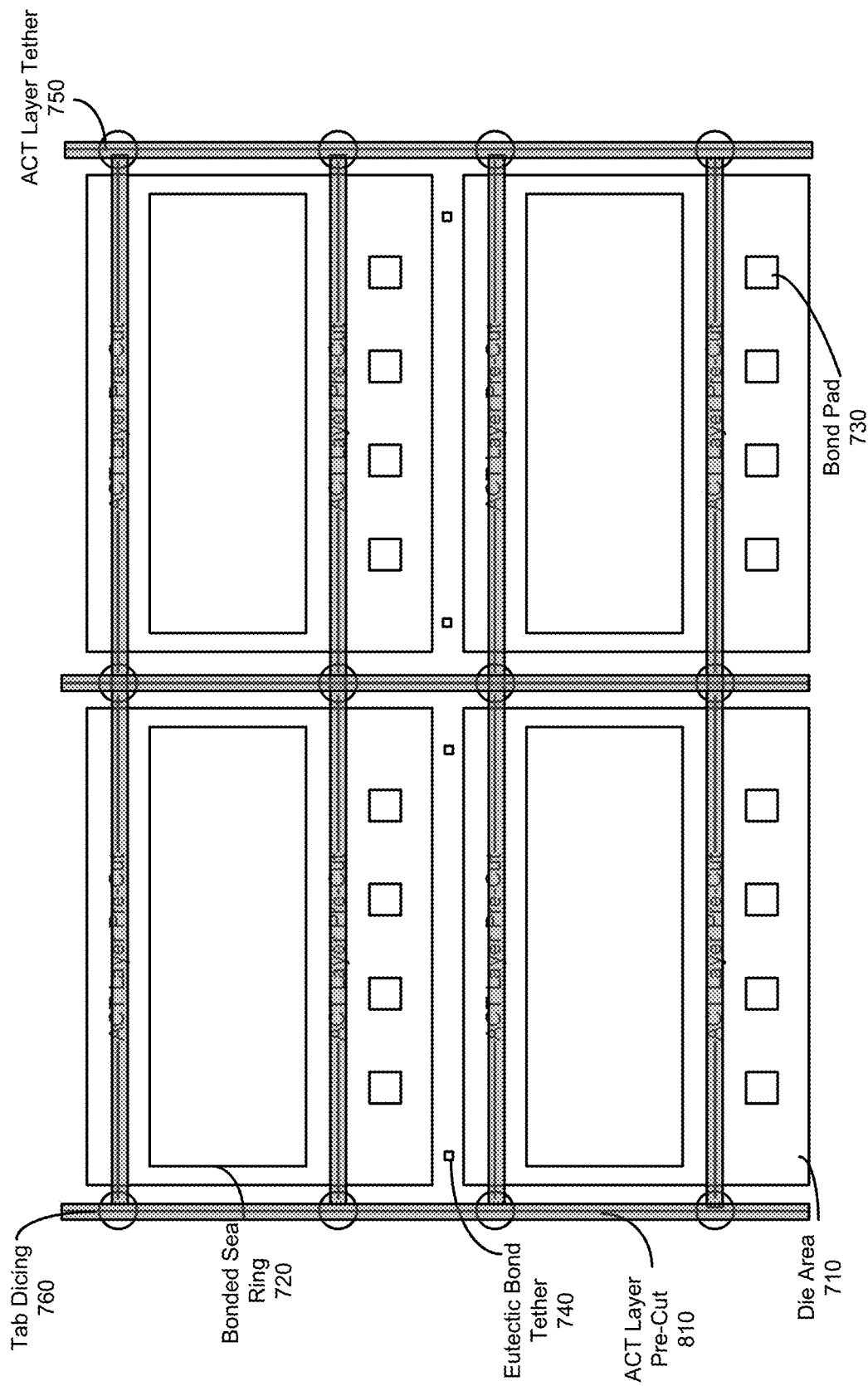

FIG. 8A-8B show another tab dicing for a MEMS device according to one aspect of the present embodiments. FIGS. 8A-8B are similar to that of FIGS. 7A-7B except that additional ACT layer pre-cuts 810 in vertical directions are also made. In FIG. 8B, similar to FIG. 7B, the pre-cut areas including the vertical cuts go through the tab dicing process.

Figure 9A:
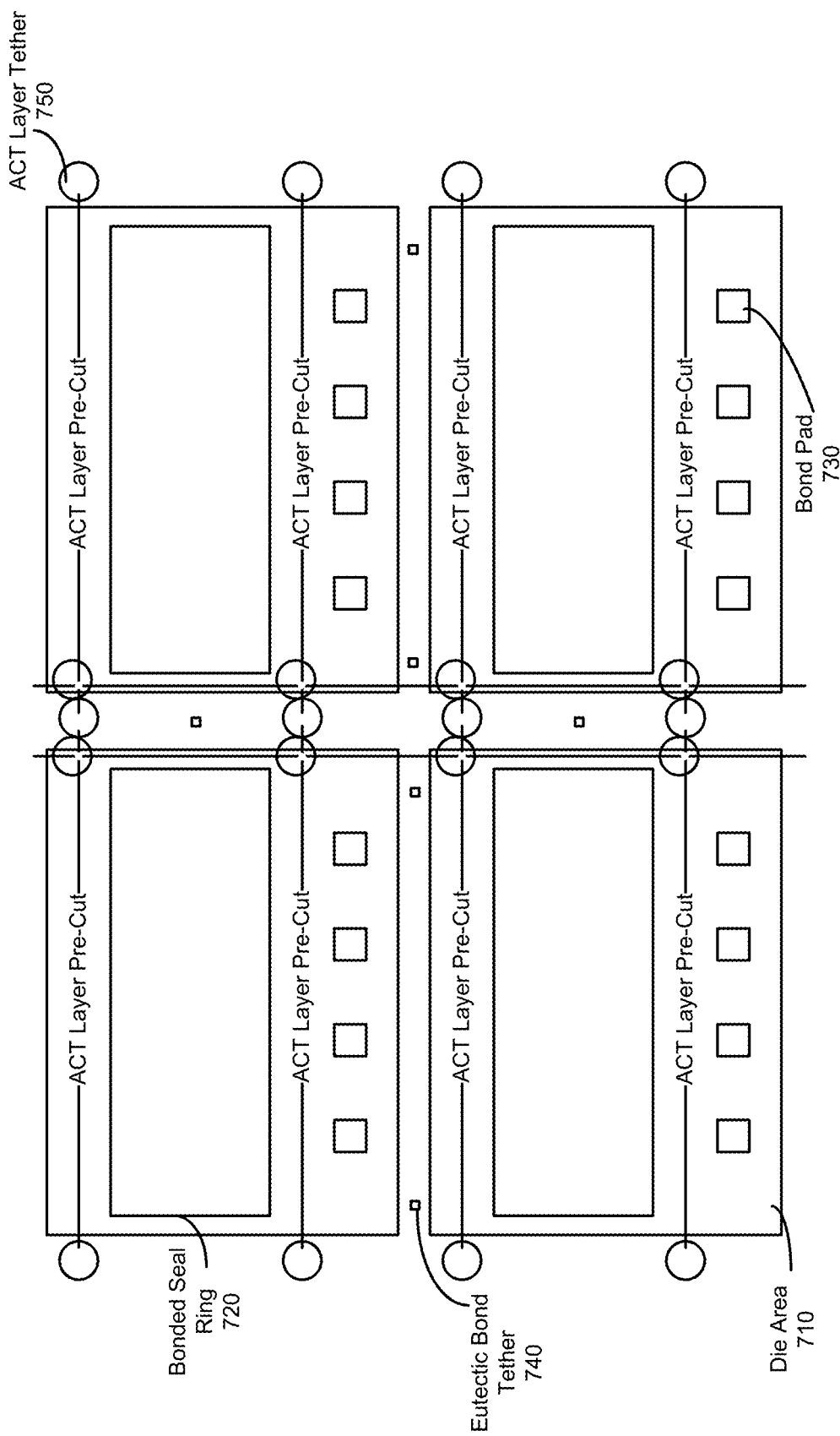
FIGS. 9A-9B show yet another tab dicing for a MEMS device according to one aspect of the present embodiments.
Figure 9B:
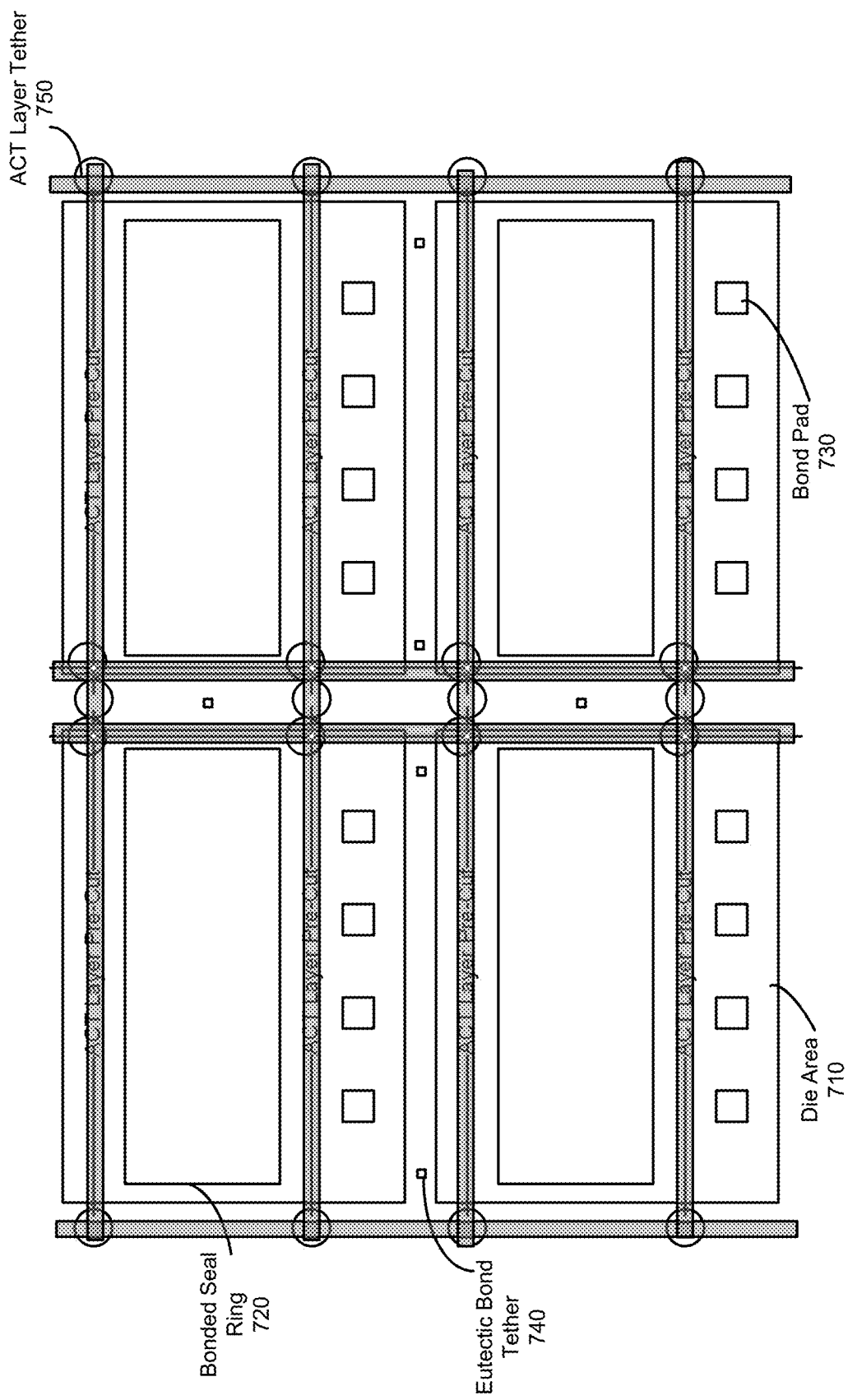

FIGS. 9A-9B show yet another tab dicing for a MEMS device according to one aspect of the present embodiments. FIGS. 9A-9B are similar to that of FIGS. 8A-8B except that in this illustrative example, two vertical cuts are made between the die areas 710 and that one or more eutectic bond tether 740 is formed between the two vertical cuts.

Figure 10:
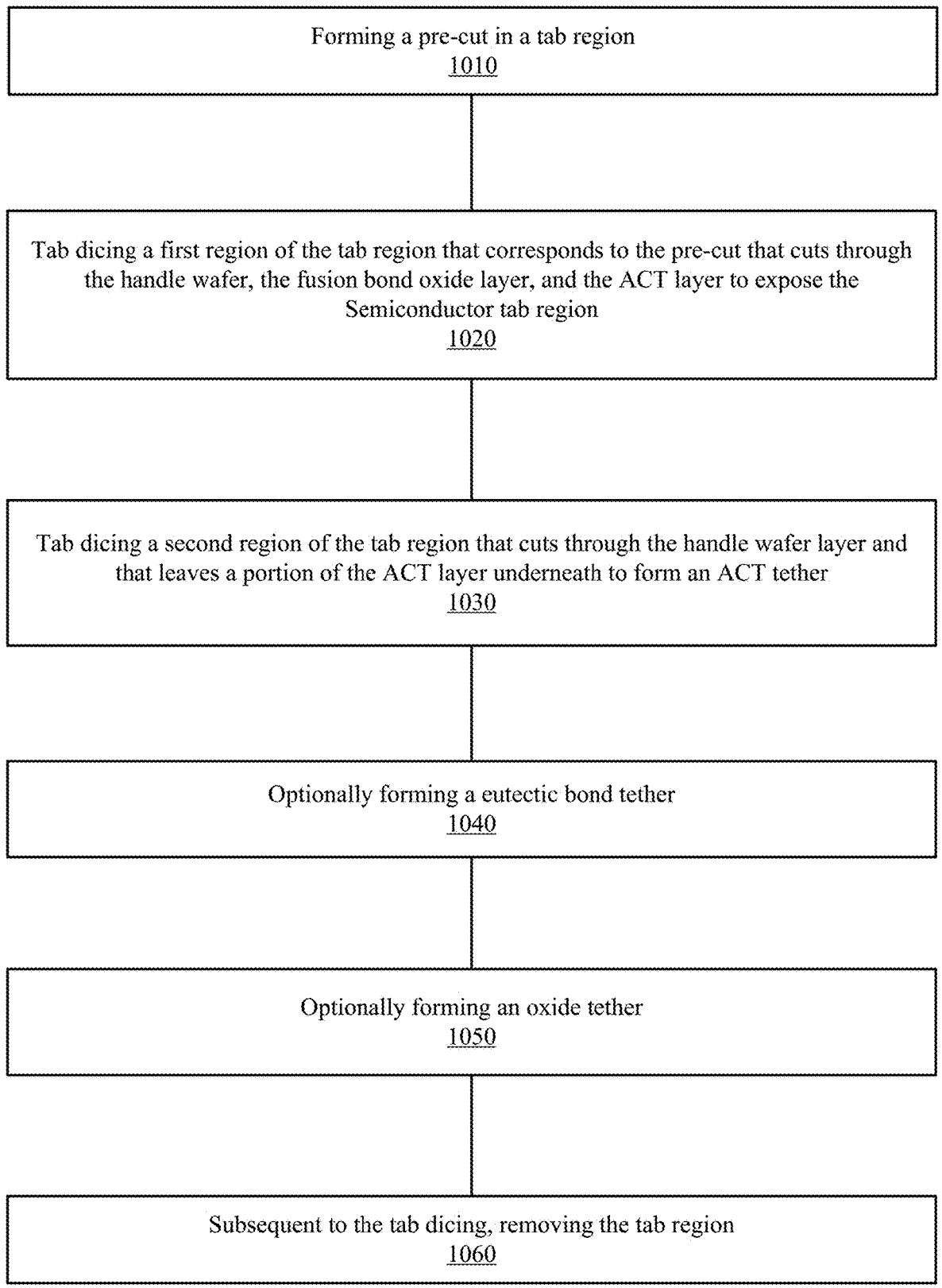
FIG. 10 shows a flow diagram for tab removal for a MEMS device according to one aspect of the present embodiments.

FIG. 10 shows a flow diagram for tab removal for a MEMS device according to one aspect of the present embodiments. At step 1010, a pre-cut is formed in a tab region, as described above in FIGS. 3A-6D. At step 1020, a first region of the tab region goes through a tab dicing process where the first region corresponds to the pre-cut and it cuts through the handle wafer, the fusion bond oxide layer, and the ACT layer to expose the CMOS tab region, as described above. At step 1030, a second region of the tab region is tab diced that cuts through the handle wafer layer and leaves a portion of the ACT layer underneath to form an ACT tether, as described above. At step 1040, a eutectic bond tether is optionally formed, as described above. Moreover, at step 1050, an oxide tether is optionally formed, as described above. At step 1060, the tab region is removed, subsequent to the tab dicing process, as described above.

FIG. 11 shows another flow diagram for tab removal for a MEMS device according to one aspect of the present embodiments. At step 1110, a first region of a tab region is tab diced that cuts through the handle wafer layer and leaves a portion of the fusion bond oxide layer underneath the handle wafer layer that was cut to form an oxide tether, as described above. At step 1120, a pre-cut in the tab region may optionally be formed, as described above. At step 1130, a eutectic bond tether may optionally be formed, as described above. At step 1140, an ACT layer tether may optionally be formed, as described above. At step 1150, the tab region is removed subsequent to the tab dicing process, as described above.

Figure 12:
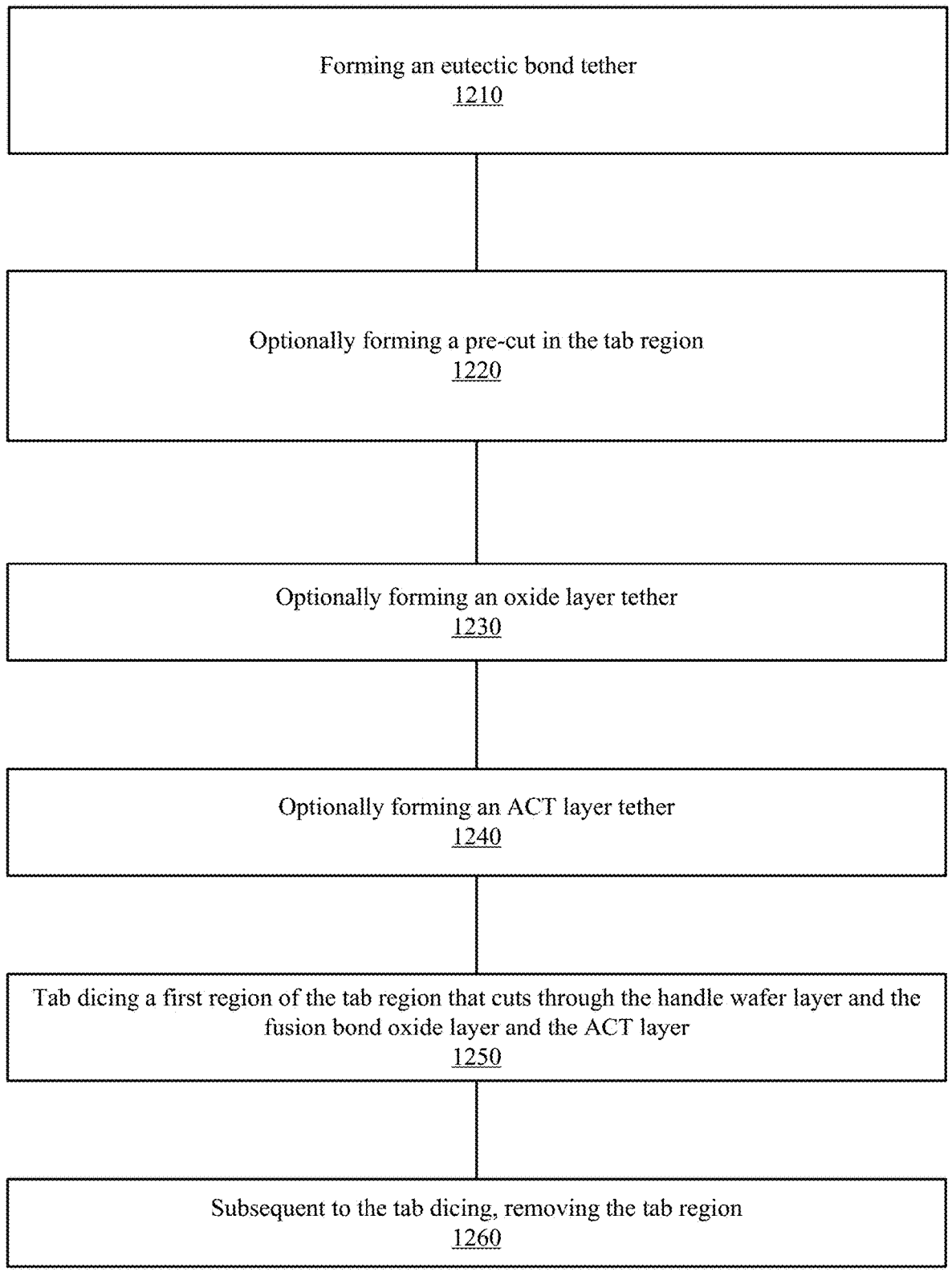
FIG. 12 shows yet another flow diagram for tab removal for a MEMS device according to one aspect of the present embodiments.

FIG. 12 shows yet another flow diagram for tab removal for a MEMS device according to one aspect of the present embodiments. At step 1210, an eutectic bond tether is formed as described above. At step 1220, a pre-cut may be optionally formed in the tab region, as described above. At step 1230, an oxide layer tether may optionally be formed, as described above. At step 1240, an ACT layer tether may optionally be formed, as described above. Moreover, at step 1250, a first region of the tab region is tab diced that cuts through the handle wafer layer and the fusion bond oxide layer and the ACT layer, as described above. At step 1260, subsequent to the tab dicing process, the tab region is removed, as described above.

As illustrated, one or more tethers are used to hold the tab region in place and connected to the die 100 after the tab dicing process. Accordingly, the tab region is not removed during the tab dicing process that may damage one or more structural areas. The tab region is subsequently removed by breaking the tethers, e.g., tape removal, vacuum pick, etc., without causing damage to the structural areas near the tab region.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
    forming a pre-cut in a tab region disposed between a first die and a second die, wherein the tab region structurally connects the first die to the second die, wherein the first die comprises a first Micro-Electromechanical System (MEMS) device eutecticly bonded to a first semiconductor device, and wherein the second die comprises a second MEMS device eutecticly bonded to a second semiconductor device, wherein the tab region includes a handle wafer layer disposed over a fusion bond oxide layer that is disposed on an actuator (ACT) layer, wherein the tab region is positioned above a semiconductor tab region, and wherein the tab region, the first die, the second die, and the semiconductor tab region form a cavity therein;
    tab dicing a first region of the tab region that corresponds to the pre-cut that cuts through the handle wafer layer, the fusion bond oxide layer, and the ACT layer to expose the semiconductor tab region;
    tab dicing a second region of the tab region that cuts through the handle wafer layer and that leaves a portion of the ACT layer underneath to form an ACT tether, wherein the ACT tether structurally maintains the tab region in place and above the semiconductor tab region; and
    subsequent to the tab dicing the first region and the second region, removing the tab region.

2. The method of claim 1, wherein the tab dicing is via one of blade sawing, plasma etching, or deep reactive-ion etching (DRIE).

3. The method of claim 1, wherein the removing is through one of a tape removal or vacuum pick.

4. The method of claim 1 further comprising forming an eutectic bond tether that structurally connects the ACT layer of the tab region to the semiconductor tab region and maintains the tab region in place and above the semiconductor tab region subsequent to the tab dicing the first and the second regions.

5. The method of claim 1 further comprising forming an oxide tether within the fusion bond oxide layer, wherein the oxide tether that is positioned over the ACT layer tether, wherein the oxide tether maintains the tab region in place and above the semiconductor tab region subsequent to the tab dicing the first and the second regions.

6. The method of claim 5, wherein the oxide tether is formed using a deep reactive-ion etching (DRIE).

7. The method of claim 1, wherein the handle wafer comprises silicon.

8. The method of claim 1, wherein the semiconductor tab region includes a bond pad that is positioned outside of a eutectic bond seal ring.

9. The method of claim 1, wherein the pre-cut in the tab region is partial cut into the ACT layer and formed during MEMS wafer processing.

10. The method of claim 1, wherein the fusion bond oxide layer forms an enclosed cavity over the ACT layer tether prior to the tab dicing the second region of the tab region.

11. A method comprising:
    tab dicing a first region of a tab region disposed between a first die and a second die, wherein the tab region structurally connects the first die to the second die, wherein the first die comprises a first Micro-Electromechanical System (MEMS) device eutecticly bonded to a first semiconductor device, and wherein the second die comprises a second MEMS device eutecticly bonded to a second semiconductor device, wherein the tab region includes a handle wafer layer disposed over a fusion bond oxide layer that is disposed on an actuator (ACT) layer, wherein the tab region is positioned above a semiconductor tab region, and wherein the tab region, the first die, the second die, and the semiconductor tab region form a cavity therein, and wherein the tab dicing cuts through the handle wafer layer and leaves a portion of the fusion bond oxide layer underneath the handle wafer layer that was cut to form an oxide tether within the fusion bond oxide layer of the tab region, wherein the oxide tether maintains the tab region in place and above the semiconductor tab region; and
    subsequent to the tab dicing the first region, removing the tab region.

12. The method of claim 11, wherein the tab dicing is via one of blade sawing, plasma etching, or deep reactive-ion etching (DRIE).

13. The method of claim 11, wherein the removing is through one of a tape removal or vacuum pick.

14. The method of claim 11 further comprising forming an eutectic bond tether that structurally connects the ACT layer of the tab region to the semiconductor tab region and maintains the tab region in place and above the semiconductor tab region subsequent to the tab dicing the first region.

15. The method of claim 14 further comprising forming an ACT layer tether within the ACT layer of the tab region, wherein the ACT layer tether is underneath the oxide tether and maintains the tab region in place and above the semiconductor tab region subsequent to the tab dicing the first region.

16. The method of claim 15, wherein the oxide tether and the fusion bond oxide layer and the ACT layer tether form an enclosed cavity therein prior to the removing.

17. The method of claim 11, wherein the handle wafer comprises silicon.

18. The method of claim 11, wherein the semiconductor tab region includes a bond pad that is positioned outside of a eutectic bond seal ring.

19. The method of claim 11 further comprising forming a pre-cut in the tab region, wherein the pre-cut cuts at least partially through the ACT layer and is positioned under the oxide tether.

20. The method of claim 19, wherein the handle wafer layer includes a cavity coated with the fusion bond oxide layer wherein the cavity is positioned over the pre-cut, wherein the fusion bond oxide layer positioned over the pre-cut forms the oxide tether.

21. A method comprising:
forming an eutectic bond tether that structurally connects a tab region to a semiconductor tab region, wherein the tab region structurally connects a first die to a second die, wherein the first die comprises a first Micro-Electromechanical System (MEMS) device eutecticly bonded to a first semiconductor device, and wherein the second die comprises a second MEMS device eutecticly bonded to a second semiconductor device, wherein the tab region includes a handle wafer layer disposed over a fusion bond oxide layer that is disposed on an actuator (ACT) layer, wherein the tab region is positioned above a semiconductor tab region, and wherein the eutectic bond tether maintains the tab region in place subsequent to a tab dicing process, and wherein the tab region, the first die, the second die, and the semiconductor tab region form a cavity therein;
tab dicing a first region of the tab region disposed between the first die and the second die that cuts through the handle wafer layer and the fusion bond oxide layer and the ACT layer; and
subsequent to the tab dicing the first region, removing the tab region.

22. The method of claim 21, wherein the tab dicing is via one of blade sawing, plasma etching, or deep reactive-ion etching (DRIE).

23. The method of claim 21, wherein the removing is through one of a tape removal or vacuum pick.

24. The method of claim 21 further comprising forming an oxide layer tether by tab dicing that cuts through the handle wafer layer and leaves a portion of the fusion bond oxide layer underneath the handle wafer layer that was cut, wherein the oxide tether maintains the tab region in place and above the semiconductor tab region subsequent to the tab dicing the first region of the tab region.

25. The method of claim 21 further comprising forming an ACT layer tether within the ACT layer of the tab region and maintains the tab region in place and above the semiconductor tab region subsequent to the tab dicing the first region of the tab region.

26. The method of claim 21, wherein the handle wafer comprises silicon.

27. The method of claim 21, wherein the semiconductor tab region includes a bond pad that is positioned outside of a eutectic bond seal ring.

28. The method of claim 21 further comprising forming a pre-cut in the tab region, wherein the pre-cut cuts at least partially through the ACT layer.

29. The method of claim 21, wherein the handle wafer layer includes a cavity coated with the fusion bond oxide layer wherein the cavity is positioned over the ACT layer.

30. The method of claim 1, wherein the first and the second semiconductor device each comprise an inter metal dielectric layer over a substrate.

31. The method of claim 1, wherein the first semiconductor device and the second semiconductor device are a complementary metal oxide semiconductor (CMOS).

* * * * *